(12) United States Patent
Kuroki et al.

(10) Patent No.: US 8,864,906 B2
(45) Date of Patent: Oct. 21, 2014

(54) METHOD FOR PRODUCING SILICON WAFER

(75) Inventors: Hidetoshi Kuroki, Kanagawa (JP);
Motoaki Yoshinaga, Kanagawa (JP);
Yutaka Shiraishi, Kanagawa (JP);
Masahiro Shibata, Kanagawa (JP)

(73) Assignee: Sumco Techxiv Kabushiki Kaisha, Kanagawa (JP)

(*) Notice: Subject to any disclaimer, the term of this patent is extended or adjusted under 35 U.S.C. 154(b) by 1608 days.

(21) Appl. No.: 11/919,071

(22) PCT Filed: Mar. 20, 2006

(86) PCT No.: PCT/JP2006/305536
§ 371 (c)(1),
(2), (4) Date: Feb. 16, 2009

(87) PCT Pub. No.: WO2006/117939
PCT Pub. Date: Nov. 9, 2006

(65) Prior Publication Data
US 2009/0301385 A1     Dec. 10, 2009

(30) Foreign Application Priority Data
Apr. 26, 2005  (JP) ................................ 2005-128483

(51) Int. Cl.
| | |
|---|---|
| *C30B 11/00* | (2006.01) |
| *C30B 15/00* | (2006.01) |
| *C30B 21/06* | (2006.01) |
| *C30B 27/02* | (2006.01) |
| *C30B 28/10* | (2006.01) |
| *C30B 30/04* | (2006.01) |
| *C30B 29/06* | (2006.01) |
| *C30B 15/20* | (2006.01) |

(52) U.S. Cl.
CPC .............. *C30B 29/06* (2013.01); *C30B 15/206* (2013.01)

USPC .................... 117/13; 117/11; 117/19; 117/20

(58) Field of Classification Search
USPC ....................... 117/13, 3, 11, 19, 20
See application file for complete search history.

(56) References Cited

U.S. PATENT DOCUMENTS 5,392,729 A * 2/1995 Kuramochi et al. ............ 117/20
5,954,873 A    9/1999 Hourai et al.
(Continued)

FOREIGN PATENT DOCUMENTS

DE       4030551 A1    4/1991
JP       10-291892     11/1998
(Continued)

OTHER PUBLICATIONS

Office action dated May 20, 2014, issued in the corresponding German Patent Application No. 11 2006 001 092.1.

(Continued)

*Primary Examiner* — James McDonough
(74) *Attorney, Agent, or Firm* — Handal & Morofsky LLC

(57) ABSTRACT

A method for producing a silicon wafer in which occurrence of slip starting from interstitial-type point defects is prevented in a part from the shoulder to the top of the straight cylinder portion of a silicon single crystal when the silicon single crystal is grown by pulling method under growth conditions entering an I-rich region. In order to prevent occurrence of slip in the range from the shoulder (10A) to the top of the straight cylinder portion (10B), the silicon single crystal (10) is pulled under conditions that the oxygen concentration Oi from the shoulder (10A) to the top of the straight cylinder portion (10B) of the silicon single crystal (10) is not lower than a predetermined concentration for preventing slip starting from interstitial-type point defects, more specifically not lower than $9.0 \times 10^{17}$ atoms/cm$^3$.

4 Claims, 20 Drawing Sheets

(56) References Cited

U.S. PATENT DOCUMENTS

| | | | |
|---|---|---|---|
| 6,174,364 B1 | 1/2001 | Yamanaka | |
| 6,217,648 B1 * | 4/2001 | Shiraishi | 117/14 |
| 6,592,662 B2 | 7/2003 | Fusegawa | |
| 6,802,899 B1 * | 10/2004 | Tamatsuka | 117/13 |
| 2002/0000188 A1 | 1/2002 | Weber et al. | |

FOREIGN PATENT DOCUMENTS

| | | | | |
|---|---|---|---|---|
| JP | H11-180793 A | 6/1999 | | |
| JP | 11-199387 | 7/1999 | | |
| JP | 11-278993 | 10/1999 | | |
| JP | H11-278993 A | 10/1999 | | |
| JP | 11-349394 | 12/1999 | | |
| JP | 2002-137988 | 5/2002 | | |
| JP | 2002-226295 | 8/2002 | | |
| JP | 02007045662 A * | 8/2005 | | C30B 29/06 |
| WO | WO 01/63027 | 8/2001 | | |

OTHER PUBLICATIONS

English Translation of office action dated May 20, 2014, issued in the corresponding German Patent Application No. 11 2006 001 092.1.

* cited by examiner

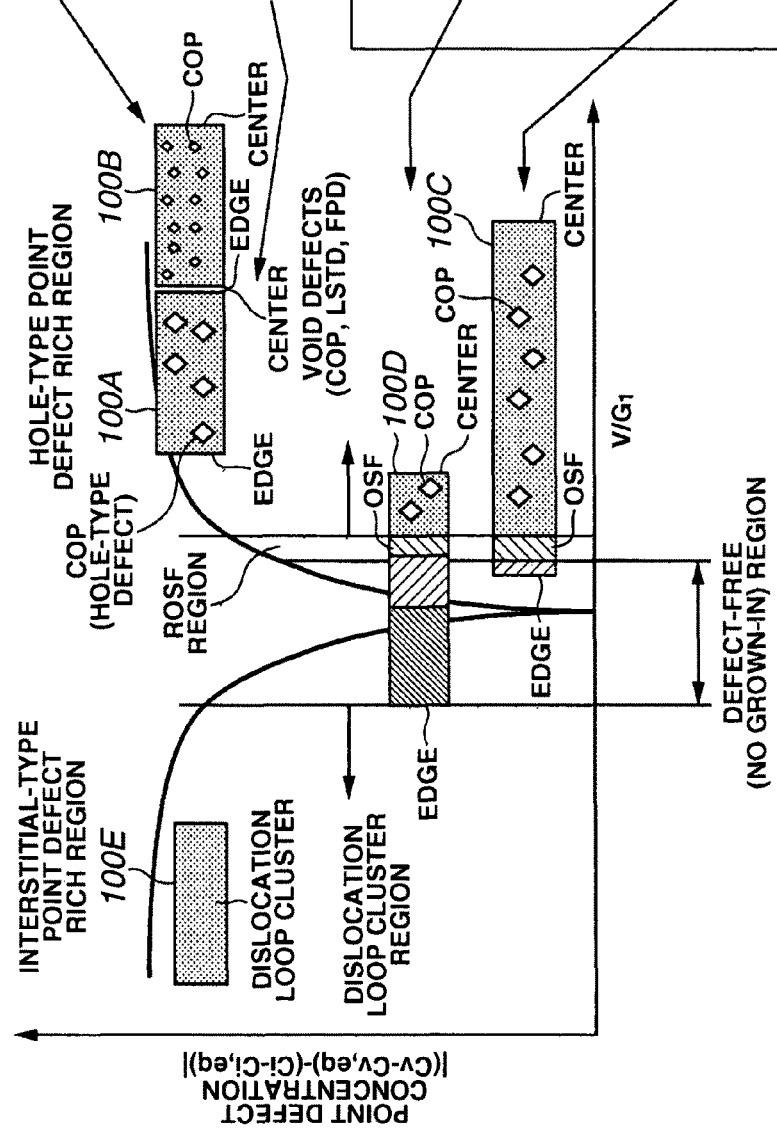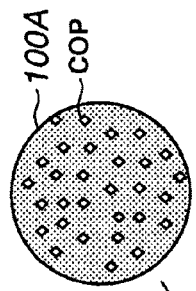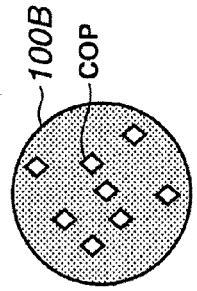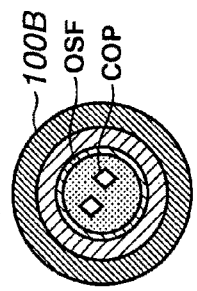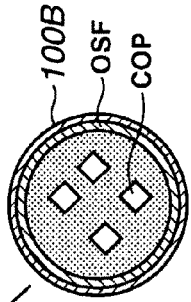

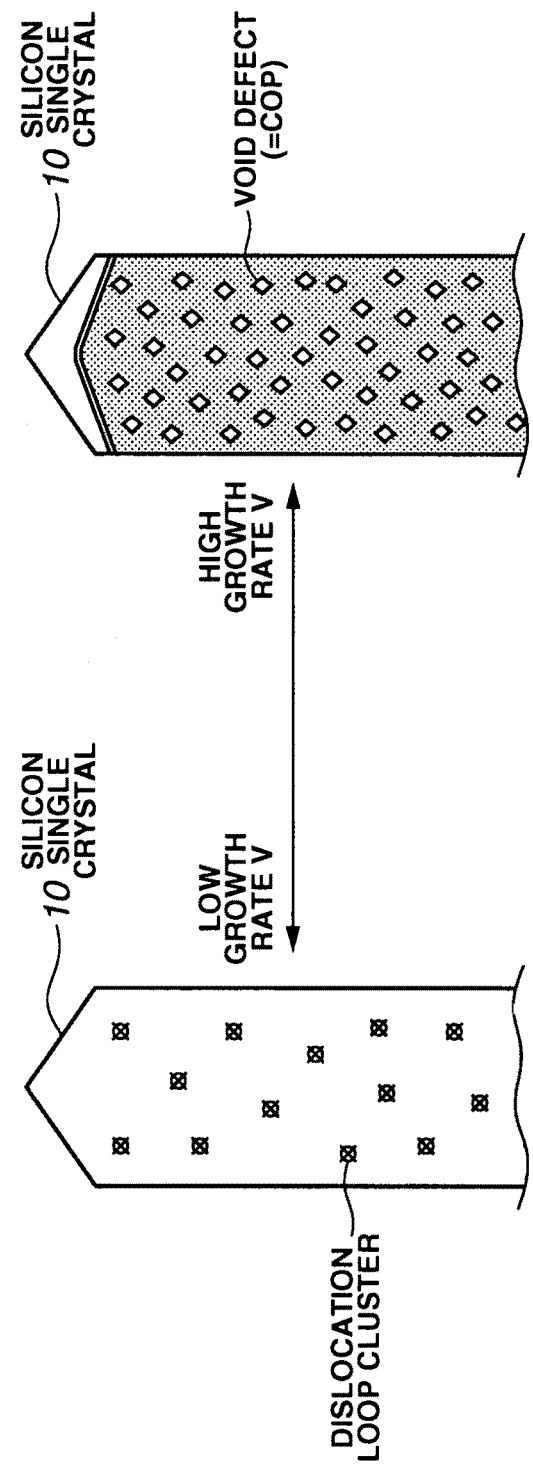

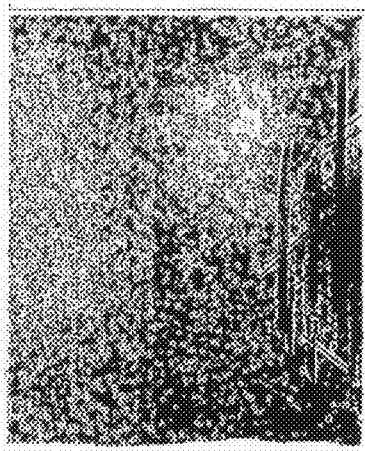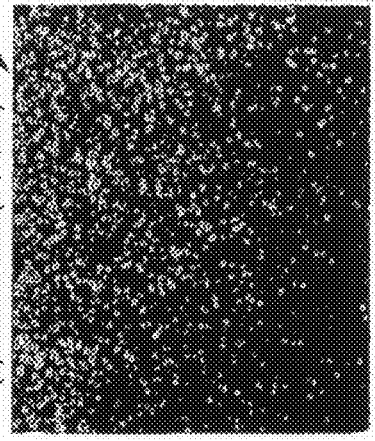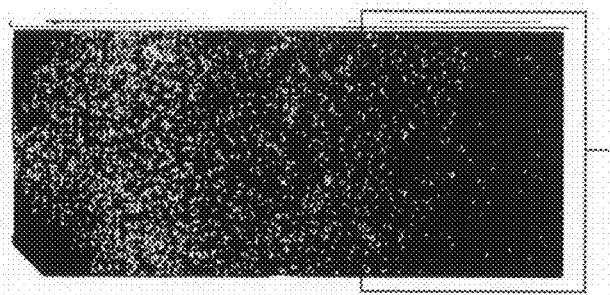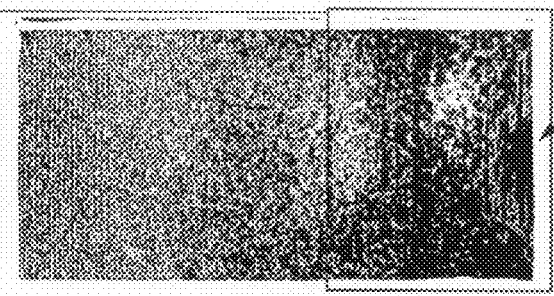

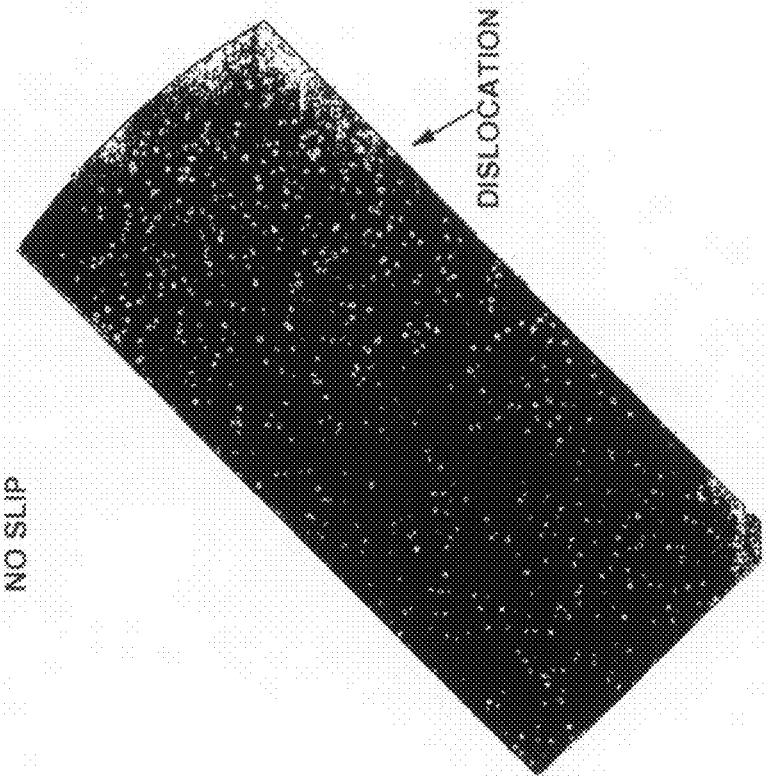
FIG.6A SLIP PRESENT
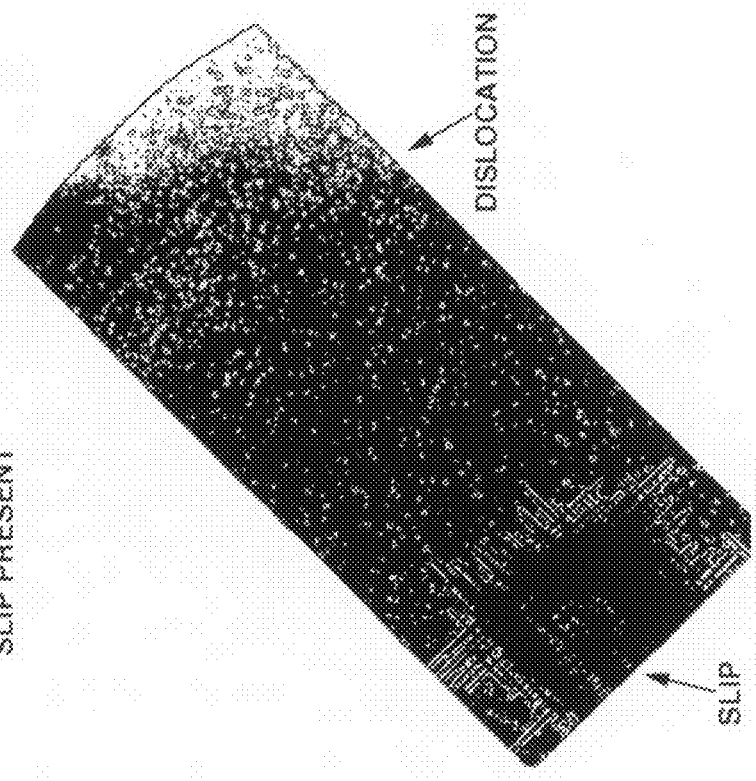
FIG.6B NO SLIP

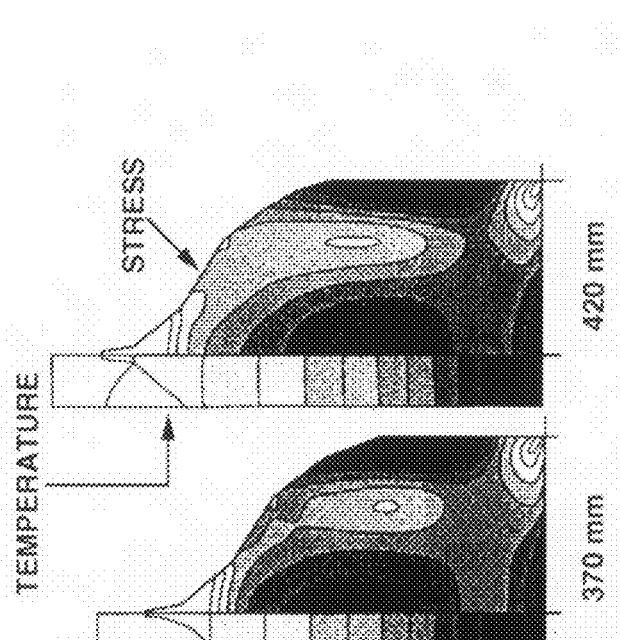
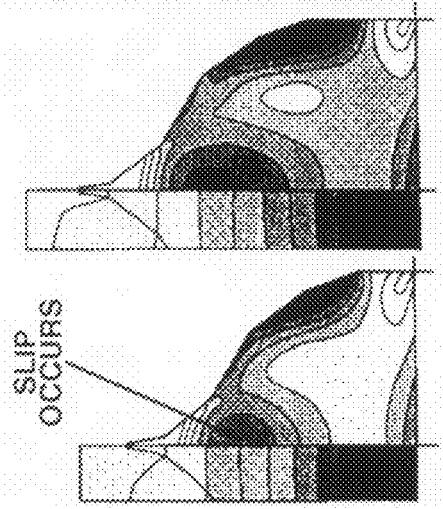
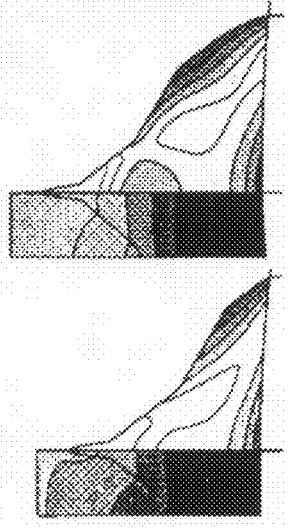
FIG.7A  FIG.7B  FIG.7C  FIG.7D  FIG.7E  FIG.7F

STRAIGHT
CYLINDER 0 mm
(X-RAY PHOTO)

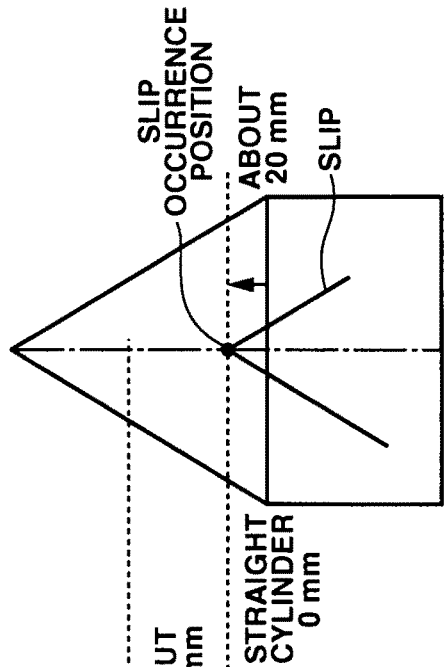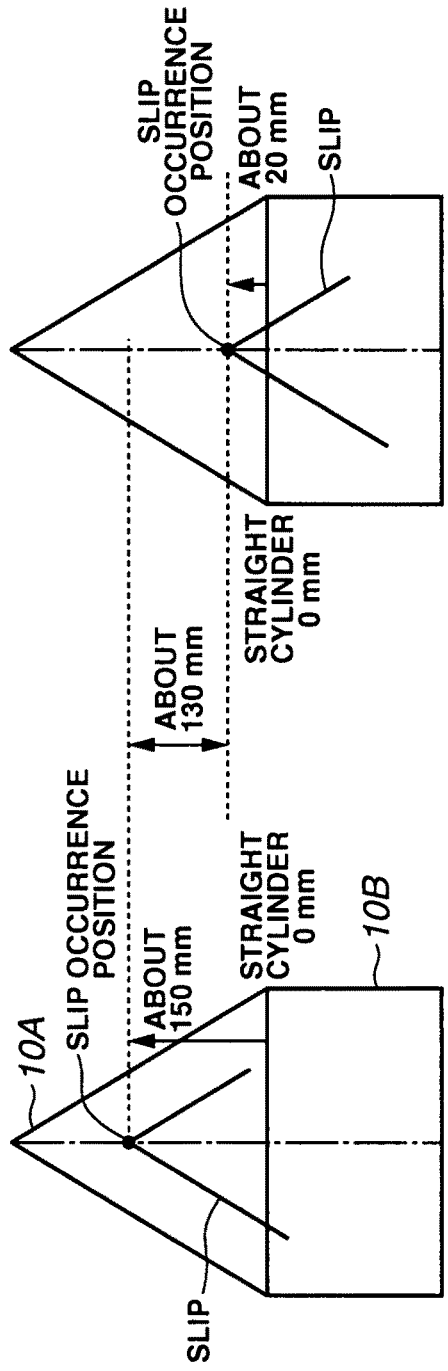

FIG.17

| | REFERENCE SITUATION | SITUATION 1 | SITUATION 2 | SITUATION 3 | SITUATION 4 |
|---|---|---|---|---|---|
| WASTED TIME DURING PULLING | SHORT | SHORT | LONG | LONG | LONG |
| WITHDRAWAL OF SHOULDER | NO | YES | YES | YES | YES |
| CRUCIBLE POSITION C/P | — | +9 mm | +9 mm | +9 mm | +9 mm |
| CONTAMINATION ON INNER SIDE OF TOP CHAMBER | LOW | LOW | HIGH | HIGH | HIGH |
| QUARTZ THICKNESS (BUBBLE EXPANSION) | THICKNESS REFERENCE VALUE | THICKNESS REFERENCE VALUE | THICKNESS REFERENCE VALUE | THICKNESS REFERENCE VALUE +5 mm | NONE |
| MS/D | 40 mm | 40 mm | 40 mm | 40 mm | 35 mm |
| THERMAL STRESS IN CRYSTAL CENTRAL PART | 7.07 Mpa | 7.14 Mpa | 7.78 Mpa | 7.79 Mpa | 7.9 Mpa |

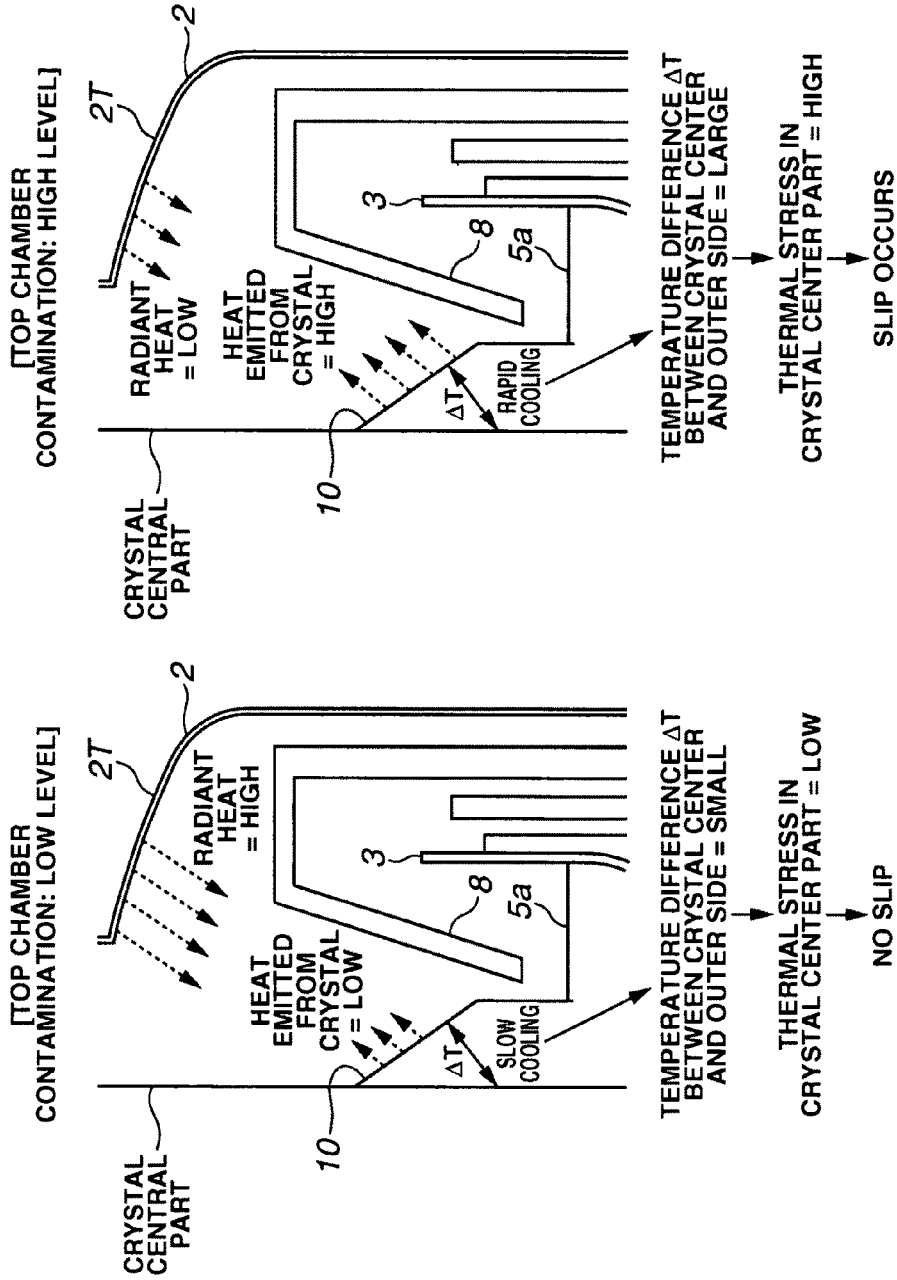

FIG.21A PULLING WITHOUT REIMMERSION
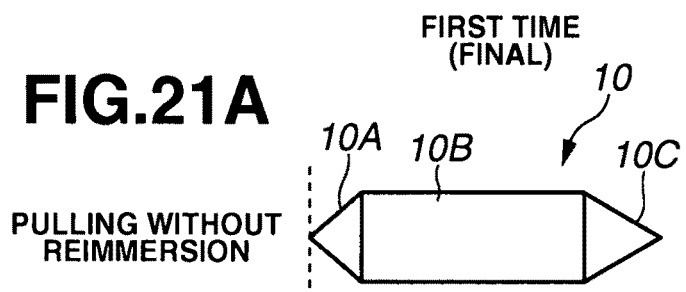
FIG.21B PULLING WITH REIMMERSION
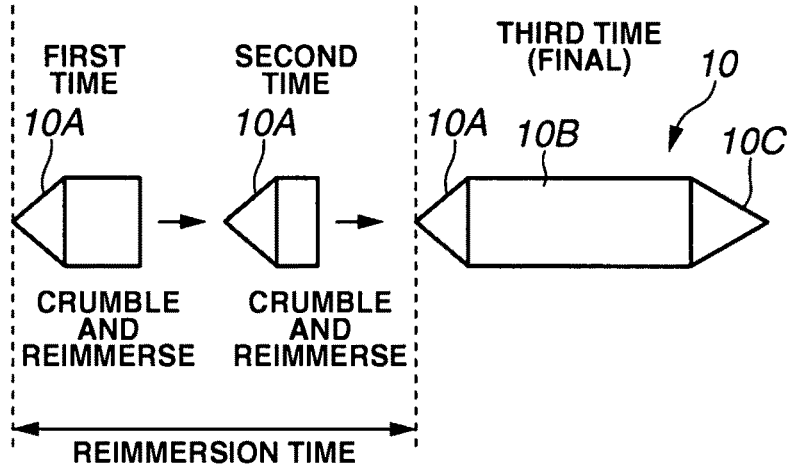

METHOD FOR PRODUCING SILICON WAFER

CROSS-REFERENCE TO RELATED APPLICATIONS

This application claims priority of PCT/JP2006/305536, filed Mar. 20, 2006, and Japanese Patent Application No. JP2005-128483, filed Apr. 26, 2005.

TECHNICAL FIELD

The present invention relates to a method for manufacturing a silicon wafer without occurrence of slip.

BACKGROUND ART

A silicon single crystal is manufactured by pulling using the CZ (Czochralski) method. The pulled silicon single crystal ingot is sliced into silicon wafers. A semiconductor device is fabricated through a device process to form a device layer on the surface of a silicon wafer.

However, a crystal defect referred to as the "grown-in defect" (defect incurred during the crystal growth) occurs in the course of the growth of a silicon single crystal.

Along with recent progress of integration and refinement of semiconductor circuits, the presence of such grow-in defects has become intolerable in the vicinity of a surface layer of a silicon wafer where a device is fabricated. Thus, studies are being conducted on the possibility of producing a defect-free crystal.

In general, there are the following three types of crystal defects which may be included in a silicon single crystal and deteriorate device characteristics.

a) Void defect generated by aggregation of vacancies and referred to as COP (Crystal Originated Particles) or the like b) OSF (Oxidation Induced Stacking Fault).

c) Dislocation loop clusters generated by aggregation of interstitial silicon (also known as interstitial silicon dislocation defects, or I-defects)

A defect-free silicon single crystal is recognized or defined as a crystal not including or substantially not including any of the three types of defects.

It is known that the generation behaviors of the above-mentioned three types of defects vary depending on growth conditions as described below. Description will be made with reference to FIG. 1A. In FIG. 1A, the horizontal axis represents the growth condition V/G1. Assuming that G1 is fixed, it can be considered as a function of the growth rate V. The vertical axis in FIG. 1A represents the point defect concentration $|(C_v - C_{v,eq}) - (C_i - C_{i,eq})|$, where $C_v$ denotes a hole concentration in a silicon single crystal 10, and $C_{v,eq}$ denotes a thermal equilibrium concentration of holes in the silicon single crystal 10. When holes are excessively incorporated, the degree of supersaturation of the holes ($C_V/C_{V,eq}$) will increase along with decrease in temperature. Void defects are generated upon the degree of supersaturation of the holes reaching a critical value. $C_i$ denotes an interstitial silicon concentration in the silicon single crystal 10, and $C_{i,eq}$ denotes a thermal equilibrium concentration of interstitial silicon in the silicon single crystal 10.

In FIG. 1A, 100A, 100B, 100C, 100D, and 100E conceptually illustrate sizes and densities of various types of defects generated between a surface center and an edge of a silicon wafer 100 obtained from the silicon single crystal 10. The surface center and the edge of the silicon wafer 100 correspond to a crystal center and a crystal edge (crystal periphery) of the silicon single crystal 10, respectively. FIGS. 1B, 1C, 11, and 1E are conceptual diagrams of the surface of the silicon wafer 100 corresponding to 100A, 100B, 100C, 100D, and 100E, respectively, and conceptually illustrating the sizes and densities of various types of defects occurring in the wafer surface.

i) When the growth rate V is high, as shown by 100A and 100B in FIGS. 1A through 1E, hole-type point defects becomes excessive and only void defects are generated in the silicon single crystal 10.

ii) When the growth rate V is decreased, as shown by 100C, a ring-shaped OSF (R-OSF) is generated near the periphery of the silicon single crystal 10 and void defects are located inside the R-OSF portion.

iii) When the growth rate V is decreased further, as shown by 100D, the radius of the ring-shaped OSF (R-OSF) becomes smaller, and a region where no defect is present is produced outside the ring-shaped OSF portion while void defects are present inside the R-OSF portion.

iv) When the growth rate V is decreased still further, as shown by 100E, dislocation loop clusters are present all over the silicon single crystal 10.

It is believed that the phenomena as described above occur for the reason that along with the decrease in the growth rate V the silicon single crystal 10 shifts from the state where excessive hole-type point defects are present to the state where excessive interstitial-type point defects are present.

In FIG. 1A, the region where void defects are present at a high density is referred to as the V-rich region (hole-type point defect rich region), and as the I-rich region (region dominated by interstitial-type point defects).

Among the three types of defects described above, the void defects in a) are particularly required to be minimized since they may cause faulty element isolation or the like in refined devices.

The void defects are produced when atomic vacancies (point defects) incorporated from a silicon melt during crystal growth agglomerate as a result of reaching a critical supersaturation during crystal cooling, and are called LPD (laser particle defect), COP (crystal oriented particle), FPD (flow pattern defect), LSTD (laser scattering tomography defect), and so forth depending on methods for detecting such defects.

As shown by 100A and 100B in FIG. 1A, when the silicon single crystal 10 is pulled under conditions such that the V-rich region in which the void defects are present all over the silicon wafer is produced, there exist COPs or the like caused by the void defects exposed in the surface of the silicon wafer 100 obtained from the silicon single crystal 10. This will incur deterioration of the oxide film pressure resistance characteristic, resulting in deterioration of the physical properties of the device. For example, faulty element isolation may occur in a refined device. Therefore, the reduction of the void defects of a) among the three types of defects described above is particularly imperative. Nowadays, the device line width has been decreased to an extent substantially corresponding to the COP size, and hence the reduction of the COPs or the like is particularly necessary.

Of course, there will be no problem if the silicon single crystal 10 is manufactured defect-free. However, very precise pulling control is required to manufacture such a silicon single crystal, incurring a problem of poor productivity.

It has been conventionally believed that, when the silicon single crystal 10 is pulled under conditions such that an I-rich region in which the interstitial-type point defects are present all over the silicon wafer is produced, there will be substantially no COPs and desirable oxide film pressure resistance characteristic can be provided without deterioration of the device characteristics.

Description will be made of related arts relating to the present invention and disclosed in patent documents.

(Related Art 1)

Patent Document 1 (Japanese Patent Application Laid-Open No. 11-349394) describes an invention in which a silicon single crystal is doped with nitrogen and pulled under pulling conditions corresponding to the I-rich region.

(Related Art 2)

Patent Document 2 (Japanese Patent Application Laid-Open No. 10-291892) describes that oxygen incorporated in a silicon single crystal increases the strength of the crystal and prevents the dislocation movement, reducing the wafer deformation (warpage) caused by heat treatment.

(Related Art 3)

Patent Document 3 (Japanese Patent Application Laid-Open No. 2002-226295) describes that resistance to slip can be expected by incorporating a large amount of oxygen into a silicon single crystal.

DISCLOSURE OF THE INVENTION

Problems to be Solved by the Invention

However, the present inventors conducted experiments, as described later, in which a silicon single crystal was pulled under growth conditions corresponding to the I-rich region, and newly found a phenomenon that slip occurred in a region of the silicon single crystal from its shoulder portion to a top part of its straight cylinder portion, starting from interstitial-type point defects.

Thus, the present inventors have for the first time elucidated the mechanism of occurrence of such slip and found means for preventing the slip.

It is therefore an object of the present invention to prevent slip from occurring starting from interstitial-type point defects, in a region of a silicon single crystal from its shoulder portion to the top part of its straight cylinder portion, when the silicon single crystal is pulled under growth conditions corresponding to the I-rich region.

It should be noted that none of the Related Arts 1, 2, and 3 discloses the novel object to be achieved by the present invention, namely the object to prevent slip from occurring starting from interstitial-type point defects in a region of a silicon single crystal from its shoulder portion to the top of its straight cylinder portion when the silicon single crystal is pulled under growth conditions corresponding to the I-rich region.

Means for Solving the Problems

A first aspect of the invention relates to a silicon wafer manufacturing method, designed to obtain a silicon wafer from a silicon single crystal that is produced by immersing a seed crystal in silicon melt contained in a quartz crucible and then pulling and growing the silicon single crystal, wherein, when the silicon single crystal is pulled and grown under conditions corresponding to an I-rich region (region dominated by interstitial-type point defects), the silicon single crystal is pulled under conditions such that an oxygen concentration in a region of the silicon single crystal from its shoulder portion to a top part of its straight cylinder portion is equal to or higher than a predetermined concentration at which no slip starting from the interstitial-type point defects occurs.

A second aspect of the invention relates to the first aspect of the invention, wherein the silicon single crystal is pulled under conditions such that the oxygen concentration in the region of the silicon single crystal from its shoulder portion to the top part of its straight cylinder portion is equal to or higher than $9.0 \times 10^{17}$ atoms/cm$^3$.

A third aspect of the invention relates to the first or second aspect of the invention, wherein the oxygen concentration in the region of the silicon single crystal from the shoulder portion to the top part of the straight cylinder portion is controlled by adjusting the number of rotations of the quartz crucible.

A fourth aspect of the invention relates to the first or second aspect of the invention, wherein the oxygen concentration in the region of the silicon single crystal from the shoulder portion to the top part of the straight cylinder portion is controlled by adjusting the number of rotations of the quartz crucible while applying a magnetic field to the silicon melt.

A fifth aspect of the invention relates to a silicon wafer manufacturing method, designed to obtain a silicon wafer from a silicon single crystal that is produced by immersing a seed crystal in silicon melt contained in a quartz crucible and then pulling and growing the silicon single crystal, wherein, when the silicon single crystal is pulled and grown under conditions corresponding to an I-rich region (region dominated by interstitial-type point defects), the silicon single crystal is pulled under conditions such that a thermal stress value in a crystal central part in the course of forming the silicon single crystal from its shoulder portion to a top part of its straight cylinder portion is equal to or lower than a thermal stress value at which no slip starting from the interstitial-type point defects occurs in the region of the silicon single crystal from the shoulder portion to the top part of the straight cylinder portion.

A sixth aspect of the invention relates to the fifth aspect of the invention, wherein the silicon single crystal is pulled under conditions such that a period of time from immersing the seed crystal in the silicon melt to starting formation of the shoulder portion of the silicon single crystal is within 40 hours.

A seventh aspect of the invention relates to the fifth or sixth aspect of the invention, wherein the silicon single crystal is pulled without reimmersion after immersing the seed crystal in the melt.

An eighth aspect of the invention relates to a silicon wafer manufacturing method, designed to obtain a silicon wafer from a silicon single crystal that is produced by immersing a seed crystal in silicon melt contained in a quartz crucible and then pulling and growing the silicon single crystal, wherein, when the silicon single crystal is pulled and growing under conditions corresponding to an I-rich region (region dominated by interstitial-type point defects), the silicon single crystal is pulled under conditions such that: an oxygen concentration in a region of the silicon single crystal from its shoulder portion to a top part of its straight cylinder portion is equal to or higher than a predetermined concentration at which no slip starting from the interstitial-type point defects occurs; and a thermal stress value in a crystal central part in the course of pulling the silicon single crystal from the shoulder portion to the top part of the straight cylinder portion is equal to or lower than a thermal stress value at which no slip starting from the interstitial-type point defects occurs in the region of the silicon single crystal from the shoulder portion to the top part of the straight cylinder portion.

FIG. 14 shows a mechanism for deciding whether slip occurs or not according to the present invention.

Specifically, even if thermal stress is applied (102) to a region of the silicon single crystal 10 in which dislocation loop clusters have been generated (101), no slip occurs (105), since the crystal strength is high (104) so far as the oxygen concentration Oi is high ($9.0 \times 10^{17}$ atoms/cm$^3$ or higher; 103). In contrast, when thermal stress is applied (102) to a region of the silicon single crystal 10 in which dislocation loop clusters have been generated (101), slip occurs (108) since crystal strength is low (107) if the oxygen concentration Oi is low (lower than $9.0 \times 10^{17}$ atoms/cm$^3$; 106).

According to the present invention, therefore, in order to prevent the occurrence of slip in the region of the silicon single crystal 10 from its shoulder portion 10A to the top part of its straight cylinder portion 10B, the silicon single crystal 10 is pulled under conditions such that the oxygen concentration Oi in the region of the silicon single crystal 10 from its shoulder portion 10A to the top part of its straight cylinder portion 10B is equal to or higher than a predetermined concentration at which no slip occurs starting from the interstitial-type point defects, specifically $9.0 \times 10^{17}$ atoms/cm$^3$ or higher (first and second aspects of the invention).

Further, according to the present invention, in order to prevent the occurrence of slip in the region of the silicon single crystal 10 from its shoulder portion 10A to the top part of its straight cylinder portion 10B, the silicon single crystal 10 is pulled under conditions such that the thermal stress value in a crystal central part in the course of pulling the silicon single crystal 10 from its shoulder portion to the top part of its straight cylinder portion is equal to or lower than a thermal stress value at which no slip occurs in the region of the silicon single crystal 10 from the shoulder portion to the top part of the straight cylinder portion starting from the interstitial-type point defects (fifth aspect of the invention).

Still further, according to the present invention, in order to prevent the occurrence of slip in the region of the silicon single crystal 10 from its shoulder portion 10A to the top part of its straight cylinder portion 10B, the silicon single crystal 10 is pulled under conditions such that: the oxygen concentration in a region of the silicon single crystal 10 from its shoulder portion to the top part of its straight cylinder portion is equal to or higher than a predetermined concentration at which no slip occurs starting from the interstitial-type point defects; and the thermal stress value in a crystal central part in the course of pulling the silicon single crystal 10 from its shoulder portion to the top part of its straight cylinder portion is equal to or lower than a thermal stress value at which no slip occurs in the region of the silicon single crystal 10 from the shoulder portion to the top part of the straight cylinder portion starting from the interstitial-type point defects. (eighth aspect of the invention).

Specific means for controlling oxygen concentration Oi are as follows.

As shown in FIG. 12, the oxygen concentration Oi in the region of the silicon single crystal 10 from its shoulder portion 10A to the top part of its straight cylinder portion 10B can be controlled by adjusting the number of rotations C/R of the quartz crucible 3 (third aspect of the invention).

Further, the oxygen concentration Oi in the region of the silicon single crystal 10 from its shoulder portion 10A to the top part of its straight cylinder portion 10B can be controlled by adjusting the number of rotations C/R of the quartz crucible 3 while applying a magnetic field to the silicon melt 5 (fourth aspect of the invention).

Specific means for controlling the thermal stress value are as follows.

It can be seen from FIG. 16 that slip occurs in the region of the silicon single crystal 10 from its shoulder portion 10A to the top part of its straight cylinder portion 10B when the reimmersion time exceeds 40 hours.

As shown in FIGS. 18A and 18B, slip is apt to occur when the reimmersion time becomes longer and the thermal stress is thereby increased.

According to the present invention, therefore, in order to prevent the occurrence of slip, the silicon single crystal 10 is pulled under conditions such that a period of time for reimmersing the seed crystal is within 40 hours (sixth aspect of the invention). Further, in order to prevent the occurrence of slip, the silicon single crystal 10 is pulled without reimmersion after immersing the seed crystal 14 in the melt (seventh aspect of the invention).

BEST MODE FOR CARRYING OUT THE INVENTION

Embodiments of the present invention will be described with reference to the drawings.

FIG. 2 is a diagram showing configuration of a silicon single crystal manufacturing apparatus for use in an embodiment, as viewed from a side.

As shown in FIG. 2, the single crystal pulling apparatus 1 according to the embodiment has a CZ furnace (chamber) 2 functioning as a single crystal pulling vessel.

A quartz crucible 3 is provided inside the CZ furnace 2 to contain molten polycrystalline silicon material as melt 5. The quartz crucible 3 is covered with a graphite crucible 11 arranged outside thereof. A main heater 9 is provided laterally outside of the quartz crucible 3 to heat and melt the polycrystalline silicon material within the quartz crucible 3. An auxiliary heater (bottom heater) 19 is provided in the bottom of quartz crucible 3 to supplementarily heat the bottom of the quartz crucible to prevent the hardening of the melt 5 in the bottom of the quartz crucible 3. The output (power; kW) of the main heater 9 and the output of the auxiliary heater 19 are controlled independently to independently regulate the amount of heat applied to the melt 5. For example, temperature of the melt 5 is detected, the detected temperature is fed back, and the outputs of the main heater 9 and the auxiliary heater 19 are controlled such that the melt 5 is heated to the target temperature.

A heat-insulating cylinder 13 is provided between the main heater 9 and the inner wall of the CZ furnace 2.

A pulling mechanism 4 is provided above the quartz crucible 3. The pulling mechanism 4 has a pulling shaft 4a and a seed chuck 4c at the tip end of the pulling shaft 4a. The seed chuck 4c holds a seed crystal 14.

Polycrystal silicon (Si) is heated and molten within the quartz crucible 3. Upon the temperature of the melt 5 being stabilized, the pulling mechanism 4 is activated to pull a silicon single crystal 10 (silicon single crystal) from the melt 5. Specifically, the pulling shaft 4a is lowered so that the seed crystal 14 held by the seed chuck 4c at the tip end of the pulling shaft 4a is immersed in the melt 5. After the seed crystal 14 is wetted with the melt 5, the pulling shaft 4a is raised. The silicon single crystal 10 grows as the seed crystal 14 held by the seed chuck 4c is raised.

The quartz crucible 3 is rotated by a rotating shaft 110 at a rotating speed C/R during the pulling. The pulling shaft 4a of the pulling mechanism 4 is rotated in the opposite direction to or in the same direction as the rotating shaft 110 at a rotating speed S/R.

The rotating shaft 110 can be driven in a vertical direction to move the quartz crucible 3 up and down to a desired crucible position C/P.

The inside of the furnace 2 is maintained at a vacuum (about 20 Torr, for example) by shielding the inside of the CZ furnace 2 from outside air. Specifically, argon gas 7 as inert gas is supplied into the CZ furnace and discharged by a pump through an exhaust port of the CZ furnace 2. This reduces the pressure in the furnace 2 to a predetermined pressure.

Various vaporized materials are generated in the inside of the CZ furnace 2 during a single crystal pulling process (one batch). Therefore, the argon gas 7 is supplied into the CZ furnace 2 and discharged together with the vaporized materials out of the CZ furnace 2 to clean away the vaporized materials from the CZ furnace 2. The supply flow rate of the argon gas 7 is set for each step in one batch.

The melt 5 is decreased as the silicon single crystal 10 is pulled. As the melt 5 is decreased, the contact area between the melt 5 and the quartz crucible 3 varies, which changes the amount of oxygen dissolved from the quartz crucible 3. This change affects distribution of oxygen concentration in the silicon single crystal 10 being pulled.

A heat shield plate 8 (gas rectifying tube) having a substantially inversed truncated cone shape is provided above the quartz crucible 3 to surround the silicon single crystal 10. The heat shield plate 8 is supported by the heat-insulating cylinder 13. The heat shield plate 8 guides the argon gas 7 supplied from above into the CZ furnace 2 as the carrier gas to a central part in the melt surface 5a, and further guides the same to the periphery of the melt surface 5a, passing over the melt surface 5a. The argon gas 7 is then discharged together with gas evaporated from the melt 5 through an exhaust port provided in a lower part of the CZ furnace 2. In this manner, the gas flow speed over the melt surface can be stabilized, and oxygen evaporated from the melt 5 can be kept in a stable state.

The heat shielding plate 8 thermally insulates and shields the seed crystal 14 and the silicon single crystal 10 grown from the seed crystal 14 from radiant heat generated by high-temperature components such as the quartz crucible 3, the melt 5, and the main heater 9. Further, the heat shield plate 8 prevents an impurity generated within the furnace (e.g. silicon oxide) from adhering on the silicon single crystal 10 and inhibiting the growth of the single crystal. The size of a gap 90 between the lower end of the heat shield plate 8 and the melt surface 5a can be adjusted by raising or lowering the rotating shaft 110 to change the position of the quartz crucible 3 in the vertical direction. The gap 90 may be adjusted by vertically moving the heat shield plate 8 by means of an elevating device.

As described later, V/G1 (where V denotes a growth rate, and G1 denotes an axial temperature gradient of the silicon single crystal 10 near its melting point (from melting point to 1350° C.)) can be controlled by adjusting the gap 90 and the pulling rate V of the pulling shaft 4a.

Further, the oxygen concentration (atoms/cm$^3$) in the silicon single crystal 10 can be controlled by adjusting the number of crucible rotations C/R, the number of pulling shaft rotations S/R, the argon gas flow rate, and the furnace pressure during the pulling.

A top portion 2A (hereafter, referred to as the top chamber) of the CZ furnace 2 is provided with a viewing window 20. An operator is allowed to observe through the viewing window 20 how the silicon single crystal 10 is growing.

An ingot of the silicon single crystal 10 manufactured by the apparatus shown in FIG. 2 is cut by a cutting apparatus to provide a silicon wafer 100.

It is assumed in this embodiment that a P-type silicon single crystal 10 is pulled. For this purpose, a dopant such as boron B is preliminarily introduced into the quartz crucible 3. The dopant concentration in the silicon single crystal 10 is controlled by adjusting the introduced amount of the dopant, whereby a P-type silicon single crystal 10 having a desired resistivity can be pulled. It is also assumed in this embodiment that silicon single crystal 10 having a diameter of 300 mm is pulled. Specifically, after immersing the seed crystal 14 in the melt 5, a shoulder portion is formed, and then a straight cylinder portion having a diameter of 300 mm is formed.

It is also assumed in this embodiment that a silicon single crystal 10 is pulled by a magnetic field applied pulling method. Specifically, a horizontal magnetic field (transverse magnetic field) for example is applied to the melt 5 in the quartz crucible 3, whereby convection of the melt 5 is suppressed in the quartz crucible 3 to ensure stable crystal growth. A cusped magnetic field may be applied instead of the horizontal magnetic field.

First, description will be made of findings of the present invention.

FIGS. 3A and 3B schematically illustrate dislocation which occurs in the silicon single crystal 10 depending on a growth rate V.

As shown in FIG. 3B, if the silicon single crystal 10 is pulled in the V-rich region (hole-type point defect rich region) shown in FIG. 1A at a high growth rate V, void defects (COP) are generated at a high density in the silicon single crystal 10. In contrast, as shown in FIG. 3A, if the silicon single crystal 10 is pulled in the I-rich region (region dominated by interstitial-type point defects) shown in FIG. 1A, interstitial-type point defects (dislocation loop clusters) are generated at a high density in the silicon single crystal 10.

The present inventors have found a phenomenon that slip occurs in a region of the silicon single crystal 10 from its shoulder portion to the top of the straight cylinder portion.

We have studied about relation between such slip and defect density.

FIG. 4A schematically shows a shoulder portion 10A, a straight cylinder portion 10B, and a tail portion 10C of the silicon single crystal 10.

An X-ray evaluation was conducted by a Cu decoration method, using a part S1 of the shoulder portion 10A of the silicon single crystal 10 as a vertically cut sample.

FIGS. 5A through 5D illustrate results of the X-ray evaluation.

FIG. 5A is a photograph of a sample in which slip has occurred, and FIG. 5C is an enlarged view of an area where the slip has occurred in FIG. 5A. FIG. 5B is a photograph of a sample in which no slip has occurred, and FIG. 5D is an enlarged view of an equivalent area.

It can be seen from FIGS. 5A through 5D that a silicon single crystal 10 suffering from slip has a high density of dislocation in its shoulder portion 10A.

FIG. 4B like FIG. 4A schematically illustrates the shoulder portion 10A, the straight cylinder portion 10B, and the tail portion 10C of the silicon single crystal 10.

An X-ray evaluation was conducted by the Cu decoration method, using a top part S2 of the straight cylinder portion 10B of the silicon single crystal 10 as a sample. The boundary position between the shoulder portion 10A and the straight cylinder portion 10B shall herein be referred to as "the straight cylinder 0 mm". The top part S2 corresponds to an area around the straight cylinder 0 mm.

FIGS. 6A and 6B show results of the X-ray evaluation.

FIG. 6A is a photograph of a sample in which slip has occurred. FIG. 6B is a photograph of a sample in which no slip has occurred.

It can be seen also from FIGS. 6A and 6B, like FIGS. 5A through 5D, that the silicon single crystal 10 suffering from slip has a high density of dislocation in the top part of the straight cylinder portion 10B.

We subsequently carried out a simulation to study about relation of slip with thermal stress in various crystal parts and temperature in a crystal central part during pulling of the silicon single crystal 10.

FIGS. 7A through 7F illustrate temperature distribution in a crystal central part and thermal stress distribution in various parts of the crystal during pulling of the silicon single crystal 10. The height to which the silicon single crystal 10 is pulled becomes higher in the sequence of FIGS. 7A, 7B, 7C, 7D, 7E, and 7F. As a result of the simulation, slip occurred at a position A in the silicon single crystal 10 when the silicon single crystal 10 was pulled to the height shown in FIG. 7C.

FIG. 8 illustrates relation of the pulling height S/P with temperature and stress in association with FIGS. 7A through 7F.

In FIG. 8, B indicates a temperature region in which dislocation loop clusters are formed (980° C. to 1000° C.). As is obvious from FIG. 8, it is believed that slip occurs when the temperature is in the temperature region where dislocation loop clusters are formed and when the stress becomes the highest. It is also believed that the position where slip occurs corresponds to an area where the stress present in a central portion of the crystal is concentrated during a process in which the crystal is pulled from the shoulder portion 10A to the top part of the straight cylinder portion 10B.

FIG. 9 illustrates distribution of thermal stress values while comparing two different cases in which conditions such as shoulder shape and crystal pulling rate S/L are set different, the two cases being shown juxtaposed on the opposite sides of the center of the crystal. In FIG. 9, the pulling conditions such as shoulder shape are differed between the left-side and the right side with respect to the center of the silicon single crystal 10. Comparing the silicon single crystal 10 on the left side and the silicon single crystal 10 on the right side in FIG. 9, it can be seen that the both of them have a stress concentrated area exhibiting high thermal stress in the crystal central part during a process in which the crystal is pulled from the shoulder portion 10A to the top part of the straight cylinder portion 10B. However, the height of the stress concentrated area in the crystal central part is different between the silicon single crystal 10 on the left side and the silicon single crystal 10 on the right side due to the difference in the pulling conditions.

Subsequently, we verified that the position where slip occurred differed according to difference in the stress concentrated area in the crystal central part.

FIGS. 10A and 10B illustrate in comparison samples of the silicon single crystal 10 having different shoulder shapes. FIGS. 10A and 10B show results of X-ray evaluation conducted at the position of the straight cylinder 0 mm. In the sample shown in FIG. 10A, slip was observed in an outer part in a radial direction of the silicon single crystal 10. In another sample shown in FIG. 10B, slip was observed in a substantially central position in a radial direction of the silicon single crystal 10.

FIGS. 11A and 11B also illustrate in comparison samples of the silicon single crystal 10 having different shoulder shapes. FIGS. 11A and 11B schematically show results of an X-ray evaluation. In a sample shown in FIG. 11A, it was observed that slip occurred starting from a position 150 mm higher than the straight cylinder 0 mm of the silicon single crystal 10. In another sample shown in FIG. 11B, it was observed that slip occurred starting from a position 20 mm higher than the straight cylinder 0 mm of the silicon single crystal 10.

It was thus confirmed that the difference in the shoulder shape caused the difference in the stress concentrated area in the crystal central part in the process of pulling the crystal from the shoulder portion 10A to the top part of the straight cylinder portion 10B, and slip occurred at various positions in a range from the shoulder portion 10A to the top part of the straight cylinder portion 10B.

It is known as described in Patent Documents 2 and 3 above that oxygen concentration in the silicon single crystal 10 affects the strength of the crystal. Since slip occurred in the range from the shoulder portion 10A to the top part of the straight cylinder portion 10B as described above, experiments were conducted to check how the oxygen concentration in the silicon single crystal 10 affected the slip in this range.

FIGS. 12, 13A and 13B show results of the experiments. In this example, means for adjusting a number of rotations of the crucible C/R was used as means for controlling the oxygen concentration Oi (atoms/cm$^3$).

Other conditions were as described below. A horizontal magnetic field (transverse magnetic field) was applied to the melt 5 in the quartz crucible 3. Desirable controllability of the oxygen concentration Oi (atoms/cm$^3$) can be obtained by regulating the number of crucible rotations C/R while applying the horizontal magnetic field to the melt 5.

Boron B was preliminarily put in the quartz crucible 3 before a P-type silicon single crystal 10 having a desired resistivity was pulled. In the following examples, however, any other dopant such as phosphorus P, arsenic As, germanium Ge, or indium In may be used instead of boron B so far as it has a crystal hardening effect. A silicon single crystal 10 having a diameter of 300 mm was grown.

In addition, a silicon single crystal 10 was pulled under conditions corresponding to the I-rich region except for a comparative example L4 to be described later. Specifically, the silicon single crystal 10 was pulled using overall heat transmission analysis FEMAG under conditions such that V/G1 satisfies V/G1<0.15 mm$^2$/° C. min. The pulling rate V of the pulling shaft 4a was adjusted to 0.3 mm/min, and the gap 90 between the lower end of the heat shield plate 8 and the melt surface 5a was adjusted to 30 mm.

Further, 250 kg polycrystalline silicon material was charged into the quartz crucible 3 to pull a silicon single crystal 10 except for a comparative example L5 to be described later.

FIG. 12 illustrates relation between axial position of the silicon single crystal 10 and the number of rotations of the crucible C/R.

FIGS. 13A and 13B illustrate relation between axial position of the silicon single crystal 10 and oxygen concentration Oi (atoms/cm$^3$) in the silicon single crystal 10 in association with FIG. 12. FIG. 13A is a diagram corresponding to the shoulder portion 10A, the horizontal axis representing the shoulder length (mm). FIG. 13B is a diagram corresponding to the straight cylinder portion 10B, the horizontal axis representing the straight cylinder length (mm). The left side end of the drawing corresponds to the position of straight cylinder 0 mm of the silicon single crystal 10.

As shown in FIG. 12, L1 indicates a characteristic when the number of crucible rotations C/R is adjusted to X rpm at various positions from the shoulder portion 10A to the top part of the straight cylinder portion 10B. L2 indicates a characteristic when the number of crucible rotations C/R is adjusted to 3× rpm at various positions from the shoulder portion 10A to the top part of the straight cylinder portion 10B. L3 indicates a characteristic when the number of crucible rotations C/R is adjusted to 4× rpm at various positions from the shoulder portion 10A to the top part of the straight cylinder portion 10. It should be noted that if the number of crucible rotations C/R is set greater than 4× rpm, the silicon single crystal 10 may crumble in the course of growth.

Oxygen concentrations Oi when the number of crucible rotations C/R is adjusted to the characteristics L1, L2 and L3 shown in FIG. 12 are shown in FIG. 13A. Changes in the oxygen concentration Oi when the number of crucible rotations C/R is adjusted to the characteristics L1, L2 and L3 shown in FIG. 12 are shown in FIG. 13B.

In FIG. 13A, L4 indicates a characteristic as a comparative example when the silicon single crystal 10 is pulled under conditions corresponding to the V-rich region. In FIG. 13B, L5 indicates a characteristic as a comparative example when 300 kg polycrystalline silicon material is charged into the quartz crucible 3 and a silicon single crystal 10 is pulled. L5 is a characteristic obtained when the number of crucible rotations C/R is adjusted to 3× rpm.

As a result of the experiments, it was confirmed that, in the silicon single crystal 10 having the characteristic of L1 obtained when the number of crucible rotations C/R was adjusted to X rpm, slip occurred in the range from the shoulder portion 10A to the top part of the straight cylinder position 10B. In contrast, in the silicon single crystal 10 having the characteristic of L2 obtained when the number of crucible rotations C/R was adjusted to 3× rpm or the characteristic of L3 obtained when adjusted to 4× rpm, no occurrence of slip was observed in the region from the shoulder portion 10A to the top part of the straight cylinder portion 10B. As seen from FIGS. 13A and 13B, the oxygen concentration Oi at the straight cylinder 0 mm of the silicon single crystal 10 having the characteristic of L1 obtained when the number of crucible rotations C/R is adjusted to X rpm is lower than $9 \times 10^{17}$ (atoms/cm$^3$). In contrast, the oxygen concentration Oi at the straight cylinder 0 mm of the silicon single crystal 10 having the characteristic of L2 obtained when the number of crucible rotations C/R is adjusted to 3× rpm or the characteristic of L3 obtained when adjusted to 4× rpm is higher than $9 \times 10^{17}$ (atoms/cm$^3$).

No occurrence of slip was observed in the range from the shoulder portion 10A to the top part of the straight cylinder portion 10B also for the comparative examples L4 and L5. In the comparative examples L4 and L5, the oxygen concentration Oi at the straight cylinder 0 mm of the silicon single crystal 10 was $9 \times 10^{17}$ (atoms/cm$^3$) or higher.

Although in this example the oxygen concentration Oi in the region from the shoulder portion 10A to the top part of the straight cylinder portion 10B of the silicon single crystal 10 is controlled by adjusting the number of rotations of the quartz crucible 3 while applying a horizontal magnetic field to the silicon melt 5, the oxygen concentration Oi in the region from the shoulder portion 10A to the top part of the straight cylinder portion 10B of the silicon single crystal 10 may be controlled by adjusting the number of rotations C/R without applying a horizontal magnetic field.

Further, although in this example the oxygen concentration Oi is controlled by adjusting the number of rotations C/R of the quartz crucible 3, the oxygen concentration Oi in the silicon single crystal 10 may be controlled by adjusting the number of rotations S/R of the pulling shaft, the argon gas flow rate, or the furnace pressure. Also in this case, a technique of applying horizontal magnetic field to the silicon melt 5 may be used in combination in order to enhance the controllability of the oxygen concentration Oi.

As seen from the results of the simulations and experiments above, the silicon single crystal 10 suffering from occurrence of slip in the region from the shoulder portion 10A to the top part of the straight cylinder portion 10B is characterized as follows.

a) Slip occurs only when the silicon single crystal 10 is pulled under conditions corresponding to the I-rich region.

b) The silicon single crystal 10 suffering from occurrence of slip has an oxygen concentration Oi lower than $9.0 \times 10^{17}$ atoms/cm$^3$ in the region from the shoulder portion 10A to the top part of the straight cylinder portion 10B.

c) The silicon single crystal 10 suffering from occurrence of slip has a high thermal stress value in the course of pulling the crystal from the shoulder portion 10A to the top part of the straight cylinder portion 10B.

It can be estimated, based on a), b), and c) above, that the mechanism to decide whether slip occurs or not is as shown in FIG. 14.

Specifically, even if thermal stress is applied (102) to a region of the silicon single crystal 10 where dislocation loop clusters are generated (101), the crystal strength is high (104) so far as the oxygen concentration Oi is high ($9.0 \times 10^{17}$ atoms/cm$^3$ or higher; 103) and hence no slip occurs (105). In contrast, when thermal stress is applied (102) to a region of the silicon single crystal 10 where dislocation loop clusters are generated (101), the crystal strength is low (107) if the oxygen concentration Oi is low (lower than $9.0 \times 10^{17}$ atoms/cm$^3$; 106) and hence slip will occur (108).

When consideration is given to enhancing the crystal strength by increasing the oxygen concentration Oi, the oxygen concentration Oi cannot be controlled until the crystal is pulled up to an end part of the shoulder portion 10A. When the length of the shoulder portion 10A is set to 220 mm, the end part of the shoulder portion 10A means a region lower than the 200 mm position.

As a result, the following matters have been found.

1) In order to eliminate occurrence of slip in the region from the shoulder portion 10A to the top part of the straight cylinder portion 10B, the silicon single crystal 10 should be pulled under conditions such that the oxygen concentration Oi is $9.0 \times 10^{17}$ atoms/cm$^3$ or higher in the region from the shoulder portion 10A to the top part of the straight cylinder portion 10B of the silicon single crystal 10.

2) In order to eliminate occurrence of slip in the region from the shoulder portion 10A to the top part of the straight cylinder portion 10B, the silicon single crystal should be pulled under conditions such that the thermal stress value in the crystal central part in the course of forming the silicon single crystal 10 from the shoulder portion 10A to the top part of the straight cylinder portion 10B is equal to or lower than the thermal stress value that does not cause slip to occur starting from the interstitial-type point defects in the region from the shoulder portion 10A to the top part of the straight cylinder portion 10B of the silicon single crystal 10 (for example, 7.1 MPa or lower).

3) In order to eliminate occurrence of slip in the region from the shoulder portion 10A to the top part of the straight cylinder portion 10B, the silicon single crystal 10 should be pulled under conditions such that the oxygen concentration Oi is $9.0 \times 10^{17}$ atoms/cm$^3$ or higher in the region from the shoulder portion 10A to the top part of the straight cylinder portion 10B of the silicon single crystal 10, and such that the thermal stress value in the crystal central part in the course of forming the silicon single crystal 10 from the shoulder portion 10A to the top part of the straight cylinder portion 10B is equal to or lower than the thermal stress value that does not cause slip to occur starting from the interstitial-type point defects in the region from the shoulder portion 10A to the top part of the straight cylinder portion 10B of the silicon single crystal 10 (for example, 7.1 MPa or lower).

Specific means for embodying 1), 2), and 3) above will be described.

The specific means for controlling the oxygen concentration Oi include means for adjusting the number of crucible rotations C/R, the number of pulling shaft rotations S/R, the argon gas flow rate, the furnace pressure, or the horizontal magnetic field applied to the melt 5.

Specific means for controlling the thermal stress value will be described.

(Reimmersion Time)

FIG. 15 is a graph illustrating relation between serial numbers for specifying single crystal pulling apparatuses and ingots to be pulled and whether the silicon single crystal 10 is reimmersed or not.

The term "reimmersion" as used herein refers to processing that is performed when the ingot crumbles in the course of pulling the silicon single crystal 10, by immersing the seed crystal 14 in the melt 5 once again, withdrawing the shoulder and pulling the crystal.

Occurrence of slip was observed in those ingots with serial numbers indicated by the arrows in FIG. 15, in the region from the shoulder portion 10A to the top part of the straight cylinder portion 10B of the silicon single crystal 10. All the ingots with the serial numbers in which occurrence of slip was observed had been reimmersed.

Consequently, it can be seen that slip is apt to occur after reimmersion.

Therefore, experiments and simulations were conducted to study about relation between reimmersion and occurrence of slip.

FIG. 16 is a graph illustrating relation between serial numbers for specifying single crystal pulling apparatuses and ingots to be pulled and reimmersion time of the silicon single crystal 10.

Definition of reimmersion time will be described using FIGS. 21A and 21B. The reimmersion time is defined as a period of time from the time at which the shoulder starts being expanded for the first time (formation of the shoulder portion 10A is started) to the time starting final formation of the shoulder portion 10A of the silicon single crystal 10 to provide a final product.

FIG. 21A shows a case in which the single crystal 10 does not crumble after starting formation of the shoulder portion 10A and thus the reimmersion time is zero. In contrast, FIG. 21B is a case in which the silicon single crystal 10 crumbles twice, reimmersion is performed twice, and a final product is obtained after the third immersion (the number of times varies depending on situations). In this case, the reimmersion time is defined by a period of time from the time starting formation of the shoulder portion 10A for the first time to the time starting formation of the shoulder portion 10A of the silicon single crystal 10 as a final product, that is, the period of time wasted by the two times of reimmersion (the number of times varies depending on situations).

Occurrence of slip was observed in those ingots with serial numbers indicated by the arrows in FIG. 16, in the region from the shoulder portion 10A to the top part of the straight cylinder portion 10B of the silicon single crystal 10. It can be seen from FIG. 16 that slip occurs in the region from the shoulder portion 10A to the top part of the straight cylinder portion 10B of the silicon single crystal 10 when the reimmersion time exceeds 40 hours.

Studies were then conducted to find why the performance of reimmersion and the elongated reimmersion time resulted in occurrence of slip.

The following phenomena take place when reimmersion is performed, the reimmersion time is elongated, and thus the wasted time in the pulling process is elongated.

d) Adhesion of amorphous is increased on the inner side of the top chamber 2T of the CZ furnace 2.

e) Processing to withdraw the shoulder portion 10A is performed in order to pull the silicon single crystal 10 without dislocation after reimmersion. As a result, the crucible position C/P is made higher.

f) A quantity of bubbles observed in a cross section of the quartz crucible 3 is increased, while the bubbles are expanded to increase the size thereof. The thickness of the quartz crucible 3 is also increased along with the increase of the quantity of and the expansion of the bubbles.

g) The change in the crucible position C/P and the change in the quartz crucible 3 described above cause a deviation between an actual value and a set value of the gap 90.

Subsequently, simulation was conducted to find how thermal stress applied to the central part of the silicon single crystal 10 varied when the changes described in d) to g) above occurred.

FIG. 17 is a table summarizing the simulation results.

As shown in FIG. 17, thermal stress values (Mpa) in a crystal central part (stress concentrated area) in the course of pulling the crystal from the shoulder portion 10A to the top part of the straight cylinder portion 10B were obtained while the parameters for wasted time during pulling, whether or not the shoulder is withdrawn, the crucible position C/P, contamination on the inner side of the top chamber 2T, the thickness of the quartz crucible (quantity and expansion of bubbles), and the gap 90 are changed for each of the situations consisting of reference situation, situation 1, situation 2, situation 3, and situation 4.

As seen from FIG. 17, there is correlation between the wasted time during pulling and the contamination on the inner side of the top chamber 2T. As the wasted time during pulling is increased, the contamination on the inner side of the top chamber 2T is also increased. When the wasted time during pulling is increased to thereby increase the contamination on the inner side of the top chamber 2T, the thermal stress value in the crystal central part is increased.

In the case of the reference situation and situation 1, the wasted time during pulling is short, hence contamination on the inner side of the top chamber 2T is low level, and the thermal stress value in the crystal central part is low (7.07 Mpa and 7.14 Mpa, respectively). In the circumference 2, situation 3, and situation 4, in contrast, the wasted time during pulling is long, hence contamination on the inner side of the top chamber 2T is high level, and the thermal stress value in the crystal central part is high (7.78 Mpa, 7.79 Mpa, and 7.9 Mpa, respectively).

FIGS. 18A and 18B are diagrams for estimating from the simulation results of FIG. 17 causal relation between contamination on the inner side of a top chamber, thermal stress value in the crystal central part, and slip. FIG. 18A illustrates a case in which contamination on the inner side of the top chamber 2T is low level, and FIG. 18B illustrates a case in which contamination on the inner side of the top chamber 2T is high level.

As shown in FIG. 18A, when the silicon single crystal 10 is pulled directly without reimmersion, there is no change in the furnace environment, for example no amorphous is generated by remelting or the like. Therefore, contamination on the inner side of the top chamber 2T becomes low level. Even if reimmersion is conducted, the change in the furnace environment will be small if the wasted time during pulling is short, and thus contamination on the inner side of the top chamber 2T becomes low. In this manner, when the contamination on the inner side of the top chamber 2T is low, the radiant heat from the inside of the top chamber 2T is increased and heat emitted from the silicon single crystal 10 is reduced. Therefore, the silicon single crystal 10 is cooled slowly and the temperature difference ΔT between the crystal central part and the outside of the crystal becomes smaller. This reduces the thermal stress in the crystal central part. No slip occurs since the thermal stress in the crystal central part is small.

In contrast, as shown in FIG. 18B, when reimmersion is performed and the wasted time during pulling is long, the furnace environment is deteriorated, for example the quantity of amorphous generated by remelting is increased. Consequently, the contamination on the inner side of the top chamber 2T is increased in proportion to the elapsed time. When the contamination on the inner side of the top chamber 2T is high level, the radiant heat from the inside of the top chamber 2T is reduced, and heat emitted from the silicon single crystal 10 is increased. Therefore, the silicon single crystal 10 is rapidly cooled, and the temperature difference ΔT between the crystal central part and the outside of the crystal becomes greater. This increases the thermal stress in the crystal central part, and hence slip occurs.

It can be seen from the above that, in order to prevent occurrence of slip, the silicon single crystal 10 should be pulled under conditions such that the reimmersion time is within 40 hours. Additionally, in order to prevent occurrence of slip, the silicon single crystal 10 should be pulled without reimmersion after immersing the seed crystal 14 in the melt.

It can be seen from FIGS. 18A and 18B described above that it depends on the magnitude of radiant heat applied to the silicon single crystal 10 whether slip occurs or not. Therefore, it is also possible to suppress the occurrence of slip by making the magnitude of the radiant heat applied to the silicon single crystal 10 stable and difficult to change. For example, some of the single crystal pulling apparatuses 1 are provided with a purge tube for supplying argon gas 7 from above the CZ furnace 2 down toward the melt 5. In such apparatuses, the purge tube functions to stabilize the radiant heat applied to the silicon single crystal 10 and to stabilize the cooling rate of the silicon single crystal 10. This prevents the occurrence of slip. (Gap)

Further, as seen from FIG. 17, some correlation was observed between the gap 90 between the lower end of the heat shielding plate 8 and the melt surface 5a and the thermal stress in the crystal central part.

In the cases of reference situation, situation 1, situation 2, and situation 3, the gap 90 is large (40 mm), and the thermal stress value in the crystal central part is relatively small (7.07 Mpa, 7.14 Mpa, 7.78 Mpa, and 7.79 Mpa, respectively). In contrast, in the case of the situation 4, the gap 90 is small (35 mm) and the thermal stress value in the crystal central part is relatively large (7.9 Mpa).

FIG. 19 is a diagram for estimating from the simulation results of FIG. 17 causal relation between the gap, the thermal stress value in the crystal central part, and slip.

In FIG. 19, 8A indicates a state in which the heat shield plate 8 is located at a position close to the melt surface 5a and the gap 90 is small, while 8B indicates a state in which the heat shield plate 8 is located at a position far from the melt surface 5a and the gap 90 is large.

In the state 8A in which the gap 90 is small, heat radiated from the melt surface 5a is shielded by the heat shielding plate 8, whereby cooling of the silicon single crystal 10 is made easier. Therefore, the temperature difference ΔT between the crystal central part and the outside of the crystal becomes great. This increases the thermal stress in the crystal central part, causing occurrence of slip.

In contrast, in the state 8B in which the gap 90 is large, the heat emitted from the melt surface 5a is difficult to be shielded by the heat shield plate 8, and hence the silicon single crystal 10 is difficult to cool. Therefore, the temperature difference ΔT between the crystal central part and the outside of the crystal becomes small. This reduces the thermal stress in the crystal central part, which suppresses occurrence of slip.

It can be seen from the above that, in order to prevent the occurrence of slip, the silicon single crystal 10 should be pulled under conditions such that the gap 90 between the lower end of the heat shield plate 8 and the melt surface 5a is large.

The mechanism to decide whether slip occurs or not can be summarized as shown in FIGS. 20A through 20C.

As shown in FIG. 20A, when reimmersion is performed (201), a longer period time is wasted during pulling (202), causing deterioration of the furnace environment such as increased amorphous due to remelting. At the same time, the contamination on the inner side of the top chamber 2T is increased in proportion to the elapsed time. When the contamination on the inner side of the top chamber 2T is increased, radiant heat from the inside of the top chamber 2T is reduced and heat emitted from the silicon single crystal 10 is increased (203). Therefore, the silicon single crystal 10 is cooled rapidly (204), and the temperature difference between the crystal central part and the outside of the crystal becomes larger. This increases the thermal stress in the crystal central part (205). Consequently, high thermal stress is applied (205) to a region of the silicon single crystal 10 in which dislocation loop clusters have been generated as a result of the silicon single crystal 10 being pulled under conditions corresponding to the I-rich region and (207). If an additional condition that the oxygen concentration Oi is low (lower than $9.0 \times 10^{17}$ atoms/cm$^3$; 206) is further satisfied, the crystal strength becomes low, resulting in occurrence of slip (207).

In contrast, as shown in FIG. 20B, even if reimmersion is performed (301), when the wasted time during pulling is short (within 40 hours of reimmersion time) (302), the change in the furnace environment is small and thus contamination on the inner side of the top chamber 2T becomes low level. When the contamination on the inner side of the top chamber 2T is low, the radiant heat from the inside of the top chamber 2T is increased, and the heat emitted from the silicon single crystal 10 is reduced (303). Therefore, the silicon single crystal 10 is cooled slowly (304), and the temperature difference between the crystal central part and the outer side of the crystal becomes small. This reduces the thermal stress in the crystal central part (305). Even if thermal stress is applied to a region of the silicon single crystal 10 in which dislocation loop clusters have been generated as a result of the silicon single crystal 10 being pulled under conditions corresponding to the I-rich region (307), the oxygen concentration Oi is low (lower than $9.0 \times 10^{17}$ atoms/cm$^3$; 306) so far as the thermal stress is low (305), an no slip will occur even if the crystal strength is low (308).

Further, as shown in FIG. 20C, when the silicon single crystal 10 is pulled directly without reimmersion, there is no change in the furnace environment (for example, no amorphous is produced by remelting), and the contamination on the inner side of the top chamber 2T becomes low level (401). When the contamination on the inner side of the top chamber 2T is low, the radiant heat from the inside of the top chamber 2T is increased, and the heat emitted from the silicon single crystal 10 is reduced. Therefore, the silicon single crystal 10 is cooled slowly, and the temperature difference between the crystal central part and the outer side of the crystal becomes small. This reduces the thermal stress in the crystal central part (402). Even if thermal stress is applied to a region of the silicon single crystal 10 in which dislocation loop clusters have been generated as a result of the silicon single crystal 10 being pulled under conditions corresponding to the I-rich region (404), the oxygen concentration Oi is low (lower than $9.0 \times 10^{17}$ atoms/cm$^3$; 403) so far as the thermal stress is low (402). Consequently, no slip occurs even if the crystal strength is low (405).

BRIEF DESCRIPTION OF THE DRAWINGS

FIGS. 1A to 1E are diagrams illustrating relation between types of defects and point defect concentration in a silicon single crystal;

FIGS. 3A and 3B are diagrams schematically illustrating dislocation occurring in a silicon single crystal in accordance with growth rates;

FIGS. 5A through 5D illustrate X-ray evaluation results, FIG. 5A being a photograph of a sample in which slip has occurred, FIG. 5C being an enlarged view of the area where the slip has occurred of the sample of FIG. 5A, FIG. 5B being a photograph of a sample in which no slip has occurred, and FIG. 5D being an enlarged view of an equivalent area;

FIGS. 6A through 6B illustrate X-RAY evaluation results, FIG. 6A being a photograph of a sample in which slip has occurred, and FIG. 6B being a photograph of a sample in which no slip has occurred;

FIGS. 7A, 7B, 7C, 7D, 7E, and 7F are diagrams illustrating temperature distribution in a crystal central part and thermal stress distribution in various parts of the crystal during the process pulling a silicon single crystal 10;

FIGS. 11A and 11B are diagrams illustrating in comparison silicon single crystal samples having different shoulder shapes;

FIG. 17 is a table summarizing simulation results;

FIGS. 18A and 18B are diagrams for estimating from the simulation results of FIG. 17 causal relation between contamination on the inner side of a top chamber, thermal stress in the crystal central part, and slip;

FIGS. 21A and 21B are diagrams used for explaining reimmersion time.

EXPLANATION OF REFERENCE NUMERALS

Figure 2:
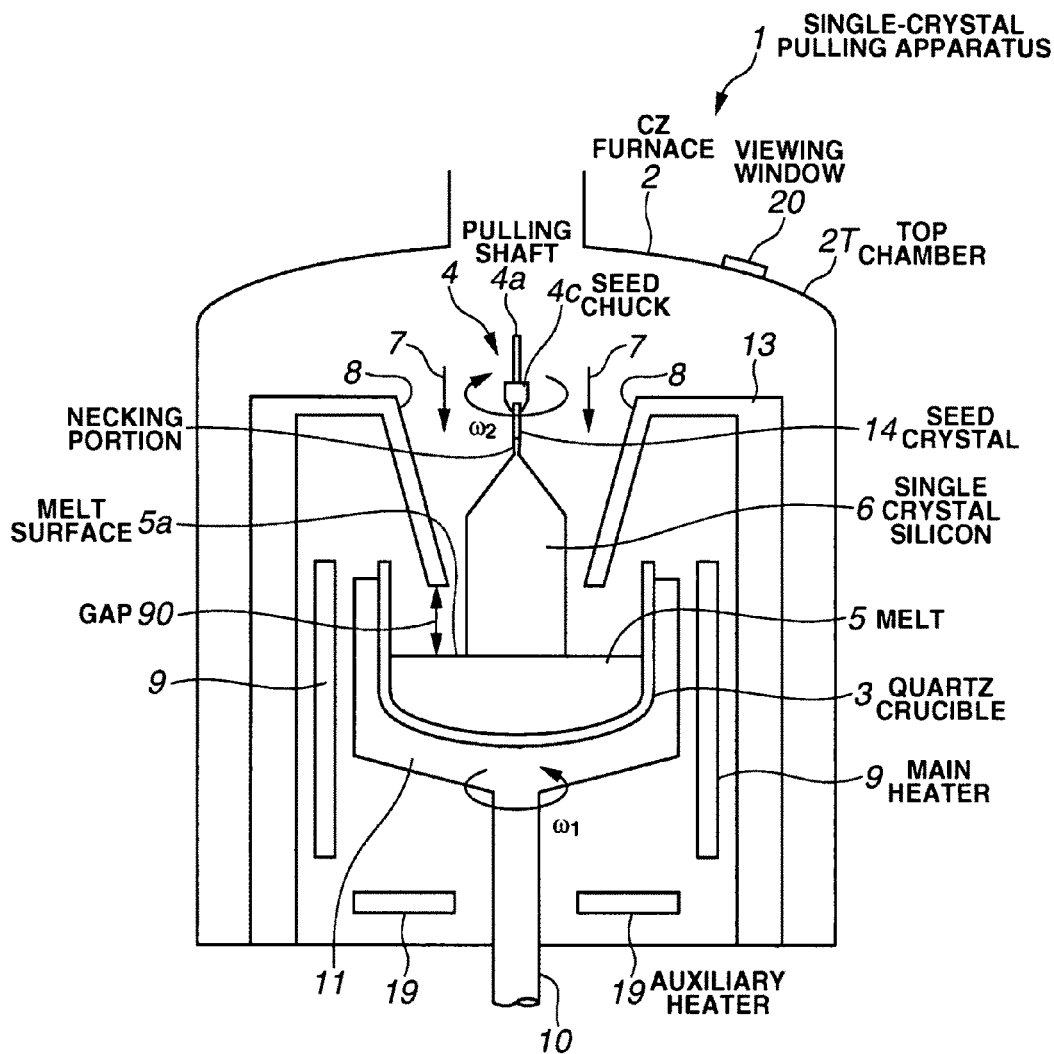
FIG. 2 is a diagram illustrating configuration of a single crystal pulling apparatus according to an embodiment.
Figure 4A:
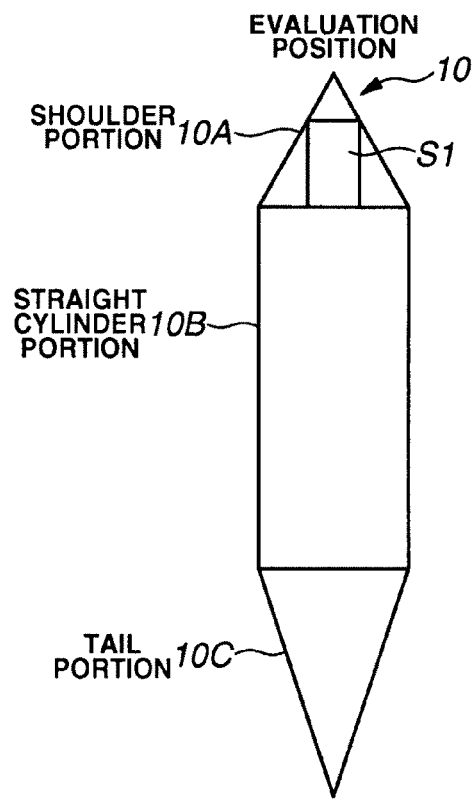
FIGS. 4A and 4B are diagrams schematically illustrating a shoulder portion, a straight cylinder portion, and a tail portion of a silicon single crystal.
Figure 4B:
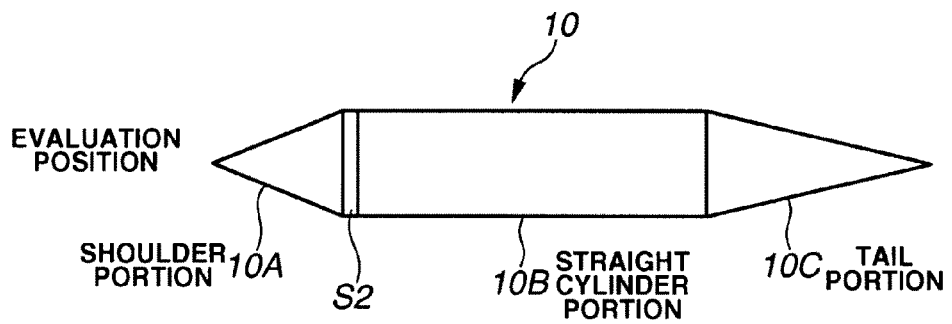
Figure 8:
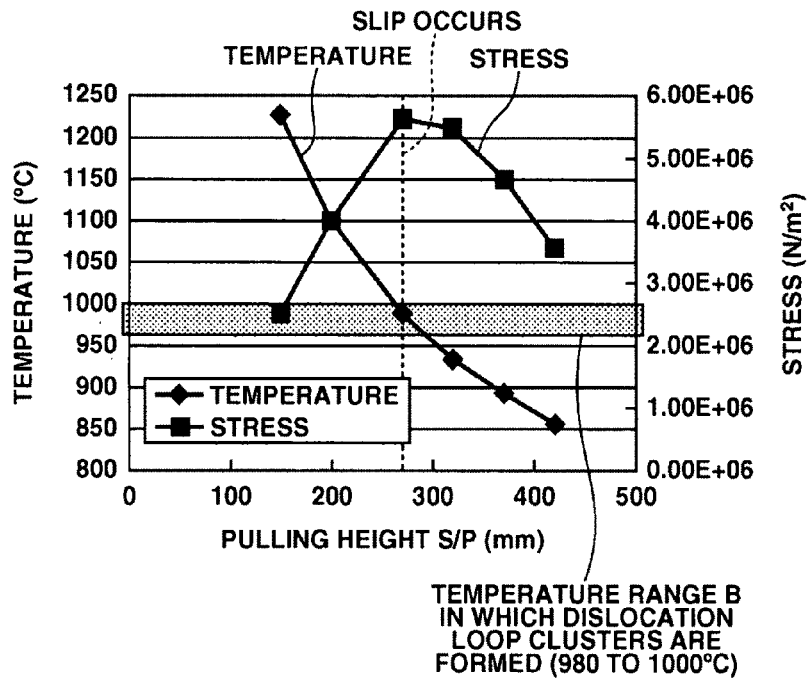
FIG. 8 is a diagram illustrating relation among pulling height, temperature, and stress in association with FIGS. 7A through 7F.
Figure 9:
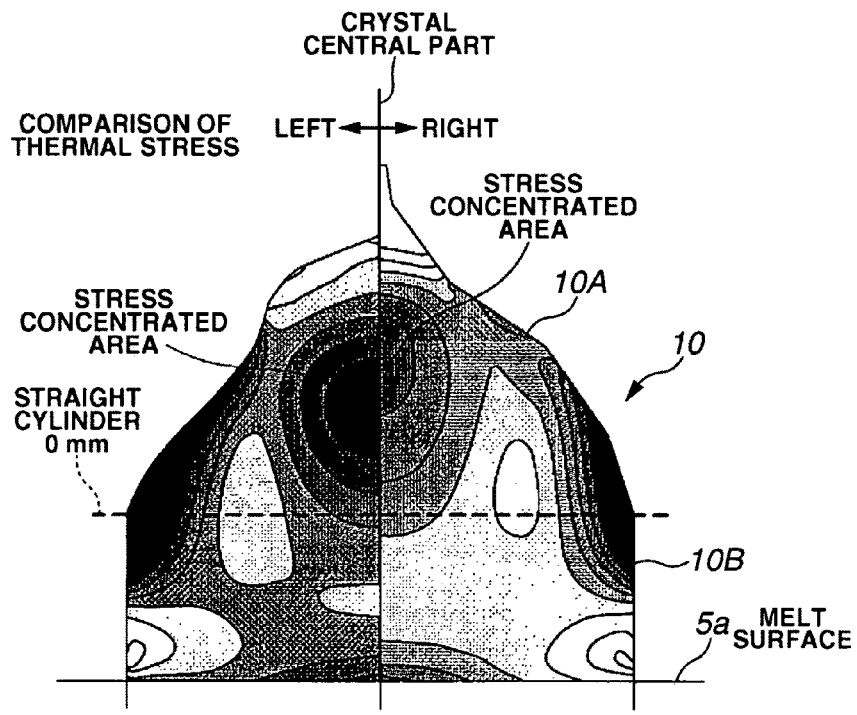
FIG. 9 is a diagram illustrating distribution of thermal stress values while comparing two different cases in which conditions such as shoulder shape and crystal pulling rate are set different, the two cases being shown juxtaposed on the opposite sides of the center of the crystal.
Figure 10A:
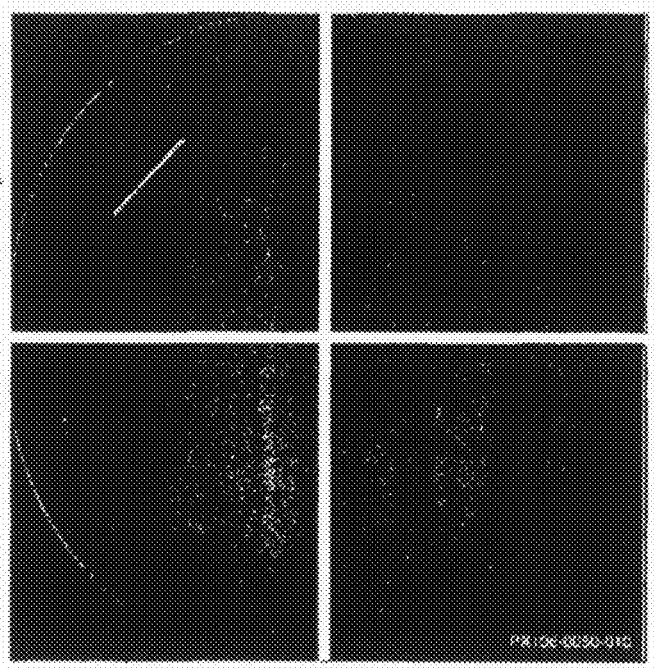
FIGS. 10A and 10 B are diagrams illustrating in comparison silicon single crystal samples having different shoulder shapes.
Figure 10B:
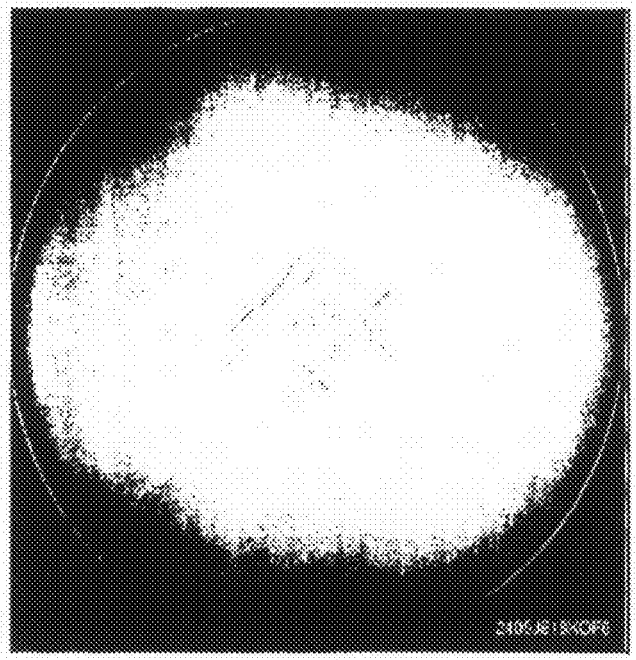
Figure 12:
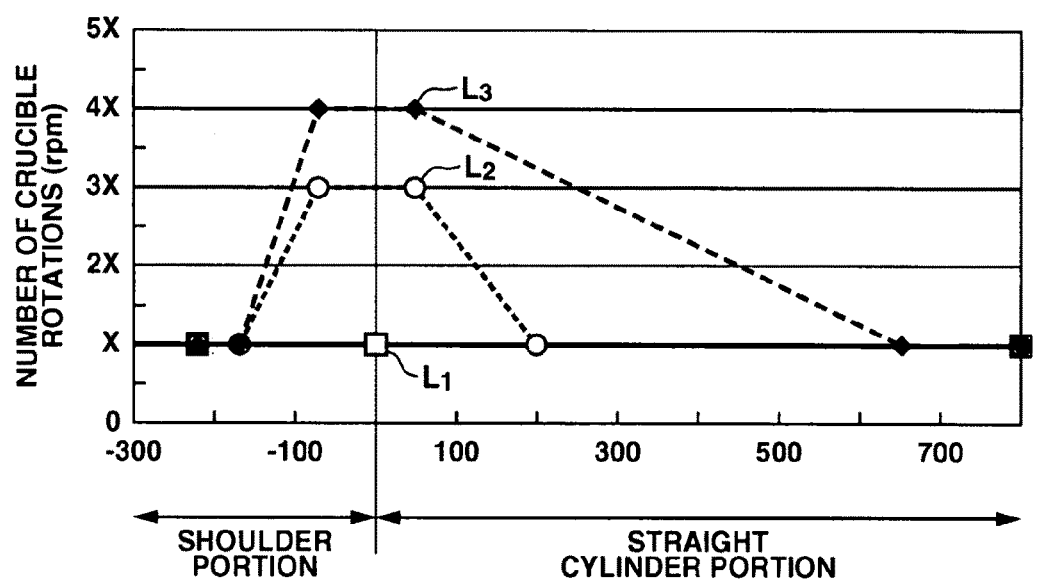
FIG. 12 is a diagram illustrating relation between position in the axial direction of a silicon single crystal and number of rotations of the crucible.
Figure 13A:
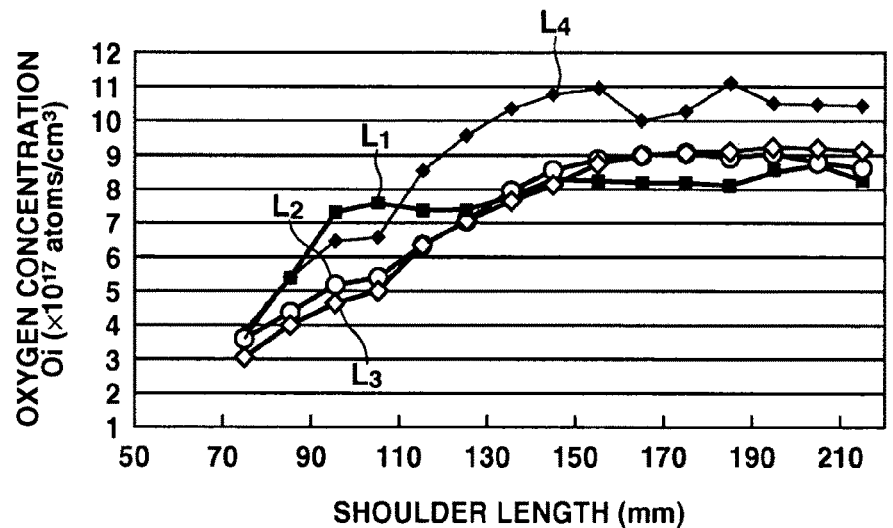
FIGS. 13A and 13B are diagrams illustrating, in association with FIG. 12, relation between position in the axial direction of a silicon single crystal and oxygen concentration Oi (atoms/cm$^3$) in the silicon single crystal.
Figure 13B:
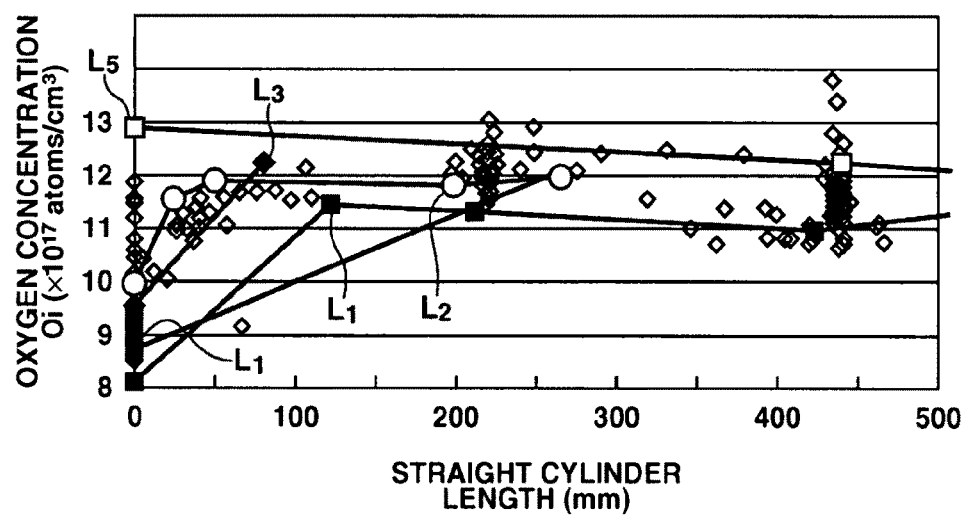
Figure 14:
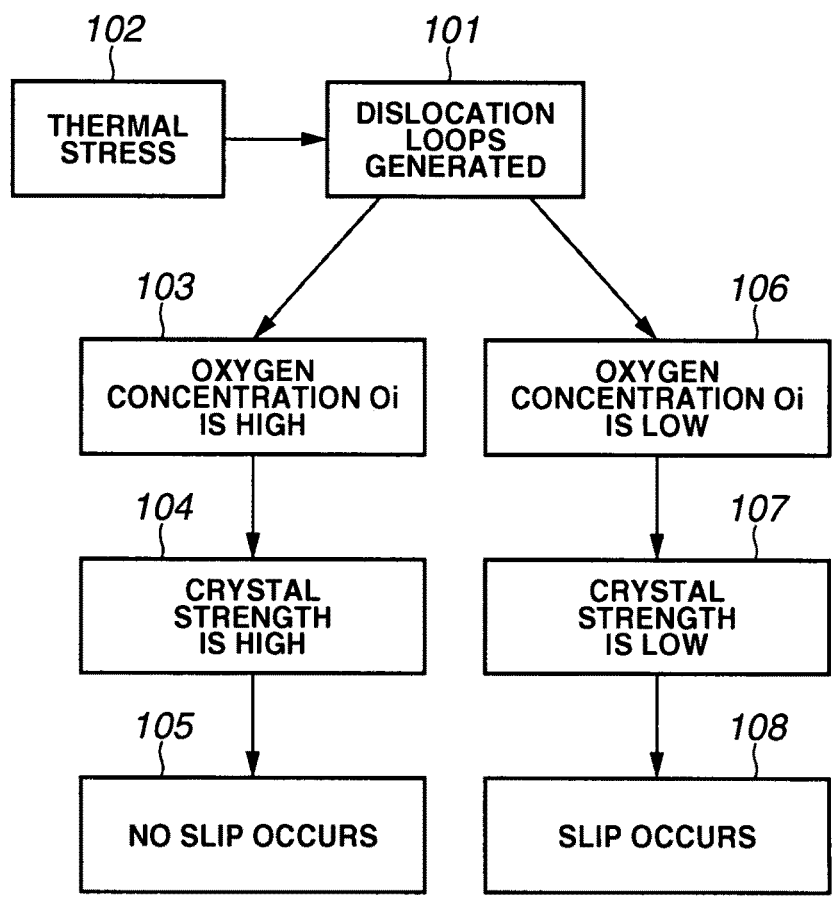
FIG. 14 is a diagram illustrating a mechanism to decide whether slip occurs or not.
Figure 15:
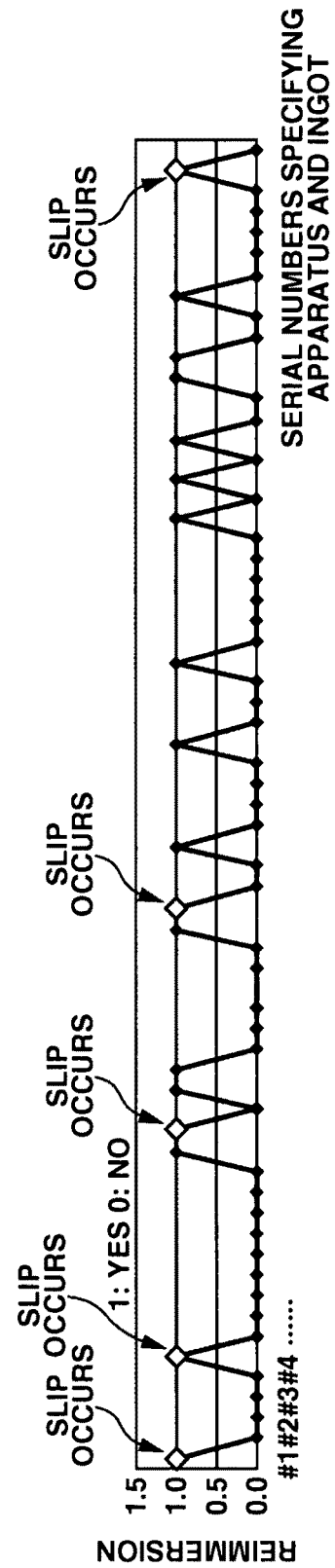
FIG. 15 is a graph illustrating relation between serial numbers for specifying single crystal pulling apparatuses and ingots to be pulled and whether the silicon single crystal is reimmersed or not.
Figure 16:
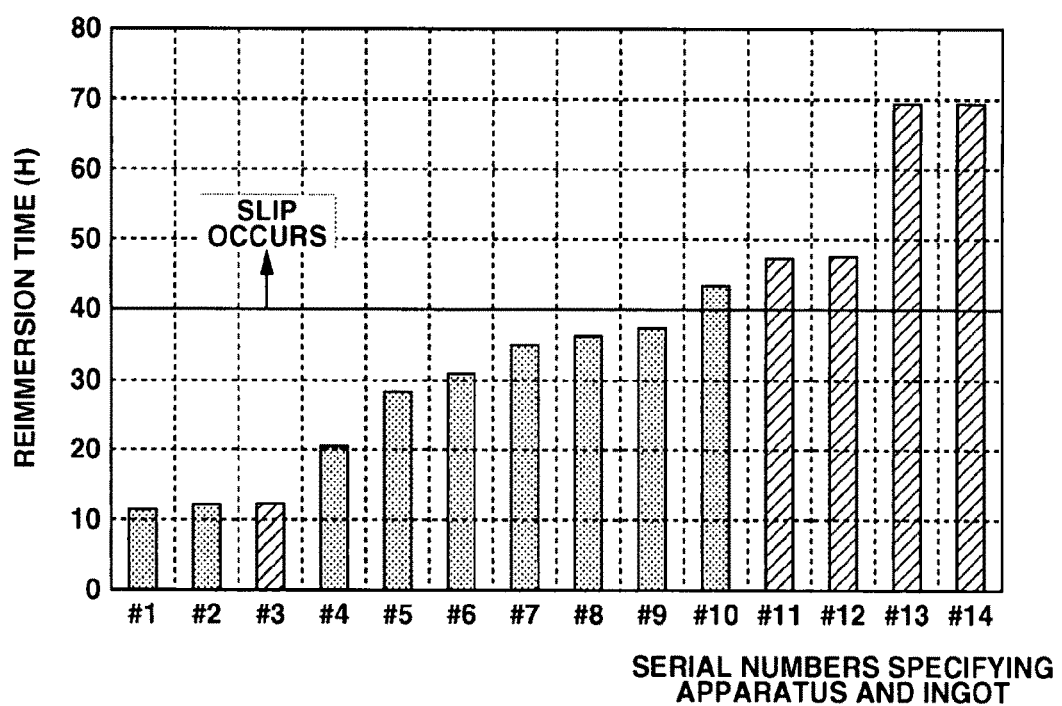
FIG. 16 is a graph illustrating relation between serial numbers for specifying single crystal pulling apparatuses and ingots to be pulled and reimmersion time of the silicon single crystal.
Figure 19:
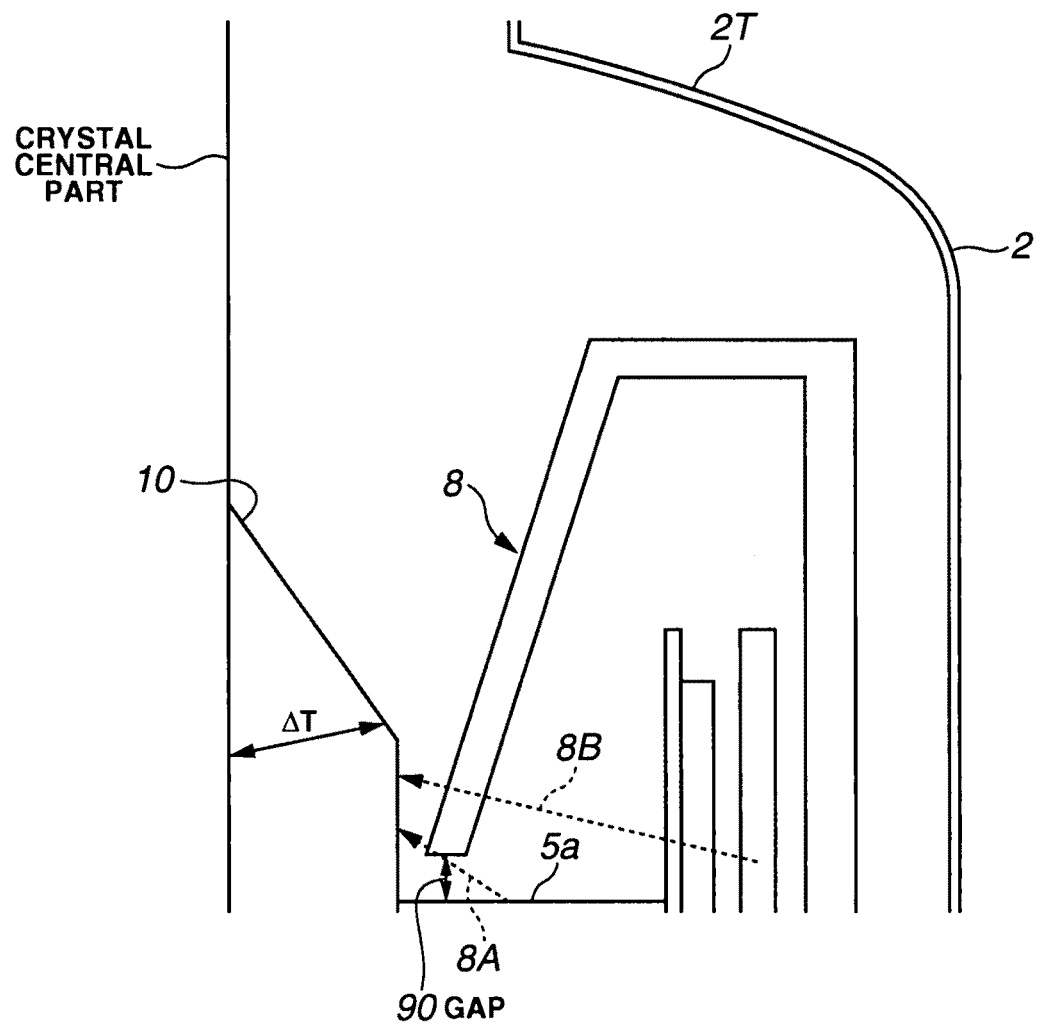
FIG. 19 is a diagram for estimating from the simulation results of FIG. 17 causal relation between gap, thermal stress in the crystal central part, and slip.
Figure 20A:
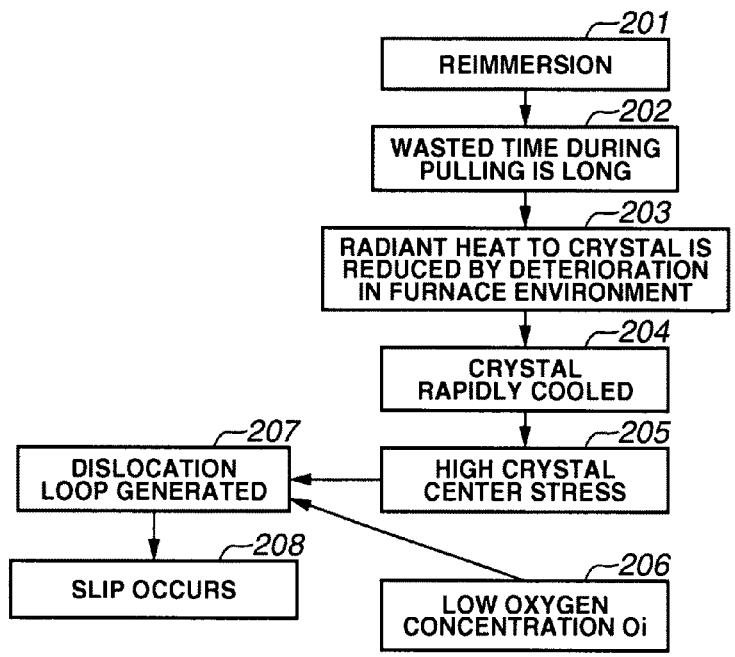
FIGS. 20A, 20B, and 20C are diagrams illustrating a mechanism deciding whether slip occurs or not.
Figure 20B:
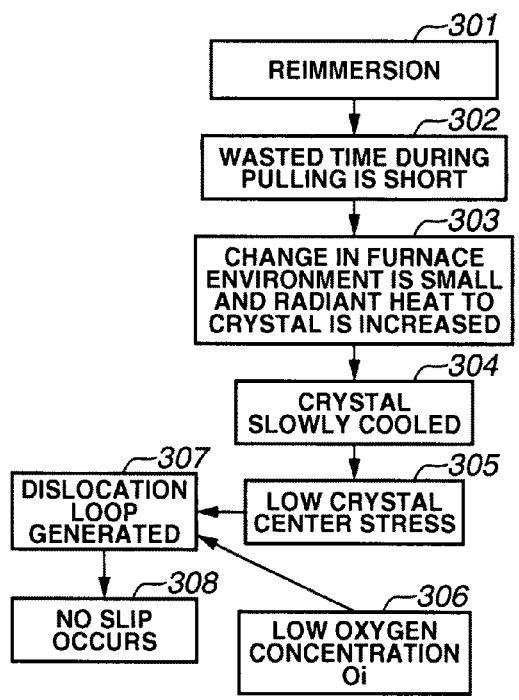
Figure 20C:
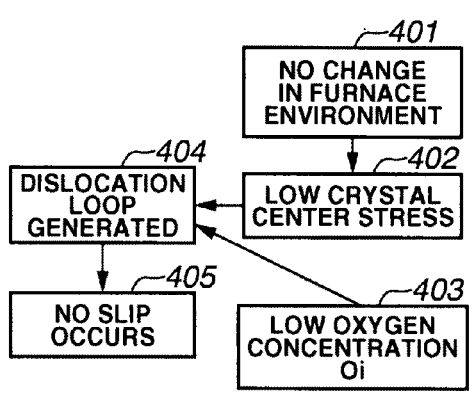

1: Single crystal pulling apparatus
2: CZ furnace
2T: Top chamber
10: Silicon single crystal
10A: Shoulder portion
10B: Straight cylinder portion

The invention claimed is:

1. A silicon manufacturing method, designed to obtain a silicon wafer from an ingot of a silicon single crystal that is produced by immersing a seed crystal in silicon melt contained in a quartz crucible and then pulling and growing the silicon single crystal, wherein, when the silicon single crystal is pulled and grown under conditions that an entire cross-sectional area of the ingot of the silicon single crystal, in an area perpendicular to an ingot pulling and growing direction, becomes an I-rich region (a region dominated by interstitial-type point defects), the ingot of the silicon single crystal is pulled under conditions such that:

among each portion of the ingot of the silicon single crystal in the ingot pulling and growing direction, an oxygen concentration in a region of the ingot of the silicon single crystal from its shoulder portion to a top part of its straight cylinder portion is equal to or higher than a predetermined concentration at which no slip starting from dislocation loop clusters occurs; and the thermal stress value in a crystal central part of the cross sectional area of the ingot of the silicon single crystal, the area being perpendicular to the ingot pulling and growing direction, in the course of forming the region of the ingot the silicon single crystal from the shoulder portion to the top part of the straight cylinder portion, among each portion of the ingot of the silicon single crystal in the ingot pulling and growing direction, is equal to or lower than a thermal stress value at which no slip starting from the dislocation loop clusters occurs in the region of the ingot of the silicon single crystal from the shoulder portion to the top part of the straight cylinder portion, the pulled and grown ingot of the single crystal is cut in the direction perpendicular to the ingot pulling and growing direction to obtain the silicon wafer, pulling the silicon single crystal while the oxygen concentration in the region from the shoulder portion to the top part of the straight cylinder portion is kept to $9 \times 10^{17}$ atoms/cm$^3$ or more and less than $13 \times 10^{17}$ atoms/cm$^3$ by adjusting a number of rotations of the quartz crucible, and pulling the silicon single crystal while the thermal stress value in the crystal central part in the course of forming the silicon single crystal from the shoulder portion to the top part of the straight cylinder portion is kept to 7.1 MPA or lower by making the time period from immersing the seed crystal in the silicon melt to starting formation of the shoulder portion of the silicon single crystal to be within 40 hours.

2. The silicon wafer manufacturing method according to claim 1, wherein the oxygen concentration in the region of the ingot of the silicon single crystal from the shoulder portion to the top part of the straight cylinder portion, among each portion of the ingot of the silicon single crystal in the ingot pulling and growing direction, is controlled by adjusting the number of rotation of the quartz crucible while applying a magnetic field to the silicon melt.

3. The silicon wafer manufacturing method according to claim 1, wherein, the ingot of the silicon single crystal is pulled without reimmersion after immersing the seed crystal in the melt.

4. The silicon wafer manufacturing method according to claim 1, wherein, the ingot of the silicon single crystal is pulled and grown under the conditions such that a V/G1 value (V: a growth rate, G1: an axial temperature gradient of the silicon crystal near its melting point (from melting point to 1350° C.) is V/G1<0.15 mm$^2$/° C.·min.

* * * * *